United States Patent
Furutani et al.

[11] Patent Number: 5,932,345
[45] Date of Patent: Aug. 3, 1999

[54] THERMALLY FUSIBLE ADHESIVE COPOLYMER, ARTICLES MADE THEREFROM, AND METHOD FOR PRODUCING THE SAME

[75] Inventors: Hiroyuki Furutani; Naoki Hase, both of Otsu; Junya Ida, Mukou; Yoshifumi Okamoto, Otsu; Hitoshi Nojiri, Otsu; Shinji Inoue, Otsu; Hirosaku Nagano, Otsu, all of Japan

[73] Assignee: Kanegafuchi Kagaku Kogyo Kabushiki Kaisha, Osaka, Japan

[21] Appl. No.: 08/714,072

[22] PCT Filed: Jan. 11, 1996

[86] PCT No.: PCT/JP96/00049

§ 371 Date: Sep. 10, 1996

§ 102(e) Date: Sep. 10, 1996

[87] PCT Pub. No.: WO96/21693

PCT Pub. Date: Jul. 18, 1996

[30]     Foreign Application Priority Data

Jan. 11, 1995 [JP] Japan ........................... 7/19658
Apr. 17, 1995 [JP] Japan ........................... 7/116402

[51] Int. Cl.$^6$ ........................................ D02G 3/00

[52] U.S. Cl. .......................... 428/364; 428/209; 428/357; 428/384; 428/473.5

[58] Field of Search ..................... 428/384, 209, 428/473.5, 357, 364

[56] References Cited

U.S. PATENT DOCUMENTS

| | | | |
|---|---|---|---|
| 4,087,862 | 5/1978 | Tsein | .................... 366/165 |
| 4,292,259 | 9/1981 | Roth et al. | ................... 261/123 |
| 4,389,312 | 6/1983 | Beard | .................... 210/198.1 |

*Primary Examiner*—Terressa Mosley
*Attorney, Agent, or Firm*—Pillsbury Madison & Sutro LLP

[57] ABSTRACT

A novel heat-fusible copolymer possessing a combination of excellent properties, including mechanical strength, resistivity against radioactive rays, chemical resistance, low temperature stability, thermal resistance, processabilty, adhesiveness, thermal fusible adhesive stability, and simultaneously satisfying requirements relating to low hygroscopic characteristic and stable dielectric constant. Also, a powder, film, laminated film, laminated insulating material, and article, such as electronic modules and capacitors, made from a thermoplastic polyimide resin composed mainly of the copolymer and suitable for use as electronic components and materials for electronic circuit components. The copolymer possesses a glass transition temperature of 100° C. to 250° C., a hygroscopic degree of 1 or less, and a dielectric rate of 3 or less, and has the following formula:

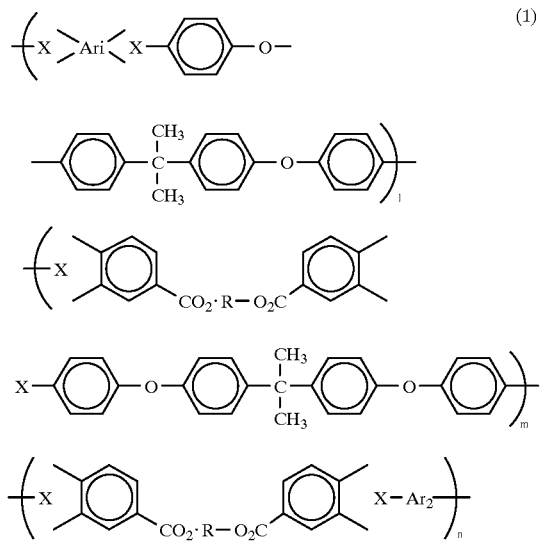

wherein $Ar_1$ represents a quadrivalent organic radical, $Ar_2$ represents a divalent organic radial, R represents a divalent organic radical, X represents trivalent bonding radicals, m and n are each integers of 0 or more, the sum of m and n being an integer of 1 or more, and 1 is an integer of 1 or more.

19 Claims, 6 Drawing Sheets

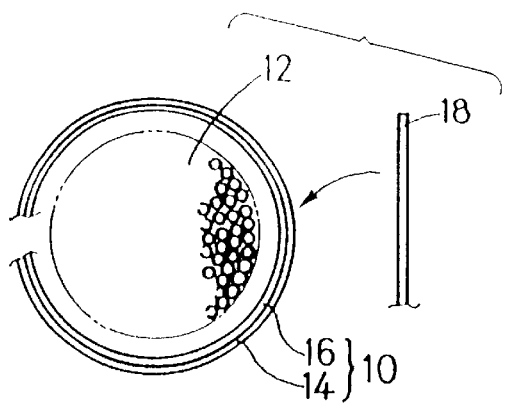 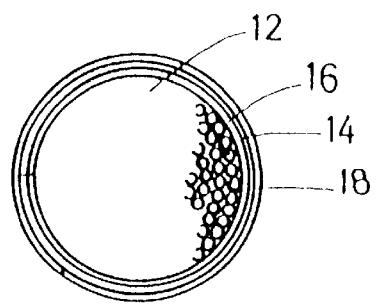
Fig. 4 (a)　　Fig. 4 (b)
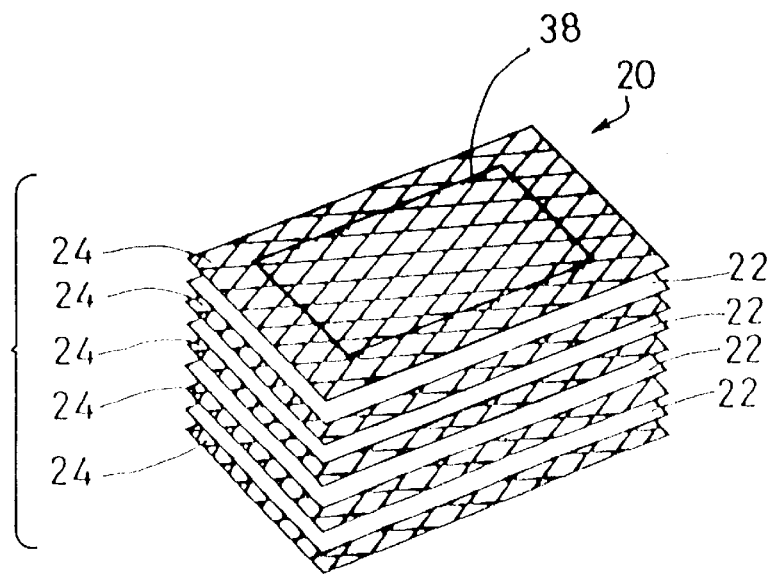
Fig. 5
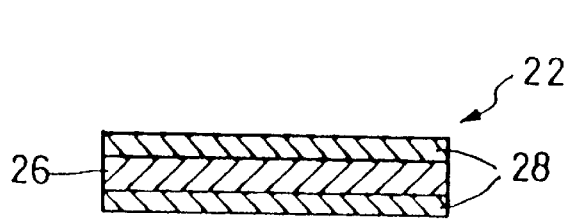 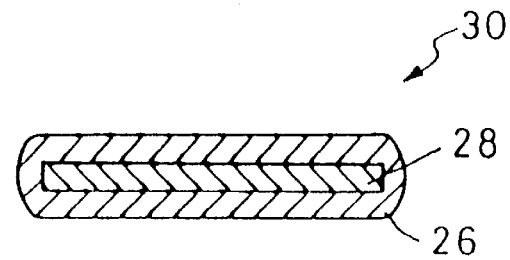
Fig. 6　　Fig. 7
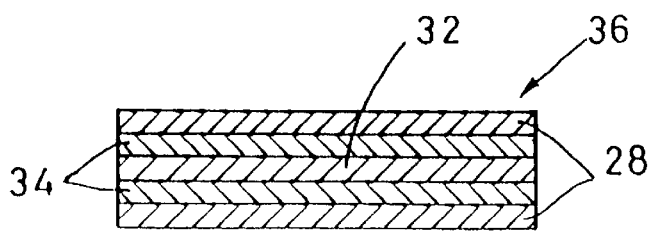
Fig. 8

THERMALLY FUSIBLE ADHESIVE COPOLYMER, ARTICLES MADE THEREFROM, AND METHOD FOR PRODUCING THE SAME

FIELD OF THE INVENTION

The present invention relates to novel copolymer having thermal fusible adhesive property, powder particles comprising thermoplastic polyimide resin mainly comprising said thermal fusible adhesive copolymer, flexible copper-coated laminate sheets, laminated films such as laminated films for insulative covering or thermal fusible adhesive films for wire covering, those films used for cover-films, cover-lay films, bonding sheets, cover coat ink, lead-on chips, or lead-frame fixing tapes, laminated insulation material, electronic modules, capacitors, and methods of producing said objects.

BACKGROUND ART

Recently, provision of higher operating performance, higher operating function, and further down-sizing has rapidly been promoted for electronic apparatuses, and accordingly, there is a greater demand for further down-sizing and lighter weight of electronic parts used for electronic apparatuses. Likewise, there is a strong demand for higher thermal resistance, higher mechanical strength, and higher electric characteristics of materials used for composing electronic parts. In addition, higher density, higher operating function and higher operating performance characteristics are demanded for the method of packaging semiconductor elements as well as for printed circuit boards for mounting them.

For example, against conventional hard printed circuit boards for loading electronic parts, flexible printed circuit boards have drawn attention of the concerned to result in the sharp increase of the demand for them. In the field of packaged semiconductor modules, for example, a variety of structures such as COL (chip on lead) for loading a chip on a lead frame devoid of die-pad or LOC (lead on chip) for loading lead wires on a chip have been proposed relative to materialization of higher functional capability and greater capacity, and these devices have actually been offered for practical service. To satisfy such requirements, wire-thinning and formation of multi-layers have been executed for flexible printed circuit boards (FPC) to result in the debut of such FPCs for mounting electronic parts, or bilateral FPCs, or such extremely dense multi-layer FPCs. This in turn results in the demand for higher performance capability of insulation adhesive agent and insulation organic film. In particular, in the case of high-density-loading materials such as Loc packages or MCMs (multi-chip module) or print-wiring material such as multi-layer FPCs or in the case of using them for composing space-aviation material, it is essential that usable materials contain extremely high thermal resistant property and mechanical strength and be capable of exerting distinguished workability and adhesive property, particularly it is required that usable materials be extremely low in moisture absorbent property, and yet, be combined with essential characteristics such as dielectric property and dimensional stability.

For the present, such films composed of polyimide resin having high thermal resistant property and mechanical strength and outstanding electric characteristic have preferentially been used as organic insulating material for making up base film or cover film of FPCs. However, normally, polyimide resin itself is substantially insoluble and infusible in the closed cycle condition. Since polyimide resin is thermally infusible, it is devoid of adhesive property. Accordingly, adhesive agent is used for adhesion and covering purpose. In many cases, because of satisfactory processable property under low temperature range (below 180° C.) and workability, epoxy resin and acrylic resin are respectively used for insulating adhesive agent. On the other hand, generally, epoxy adhesive agent is mainly used for adhering a cover-lay film onto circuit surface of a flexible printed circuit board. However, it is essential that a perforation process be executed against the cover-lay film before adhering the film onto the flexible printed circuit board. Conventionally, positioning of the cover-lay film against the flexible printed circuit board has substantially been performed via manual work to result in the poor workability and increased cost. And yet, both of the above-cited adhesive agents have proved to be inferior to polyimide resin in terms of thermal resistant property as a result of incurring deterioration at a high temperature range (250° C.), thus raising problem in that said conventional adhesive agents failed to fully activate proper characteristics of polyimide resin used for the base film of FPCs.

In the case of a semiconductor module comprising COL or LOC structure for example, the semiconductor chip is secured to a lead frame with adhesive agent. Outstanding adhesive property is required for the usable adhesive agent without causing interface between the chip and the lead frame to be separated when moisture is absorbed and whenever the chip and the lead frame are subject to thermal stress caused by reflow-soldering or temperature cycle. From the viewpoint of facilitating mass production, it is desired that adhesion be achieved in the shortest period of time, and yet, based on the usable form, it is desired that adhesion be implemented at a relatively low temperature range. There is such an incidental case in which package crack or burst may be generated by water absorbed in the adhesive agent layer in the package structure after being steamed by soldering heat. To prevent incidental package crack or burst from occurrence, it is required that moisture absorbent property of adhesive agent layer be as low as possible. In addition, there are a variety of characteristics being required for usable adhesive agent, and thus, selection of adhesive agent makes up an important issue in the production of semiconductor modules.

However, dielectric characteristic and moisture absorbent property of conventional adhesive agents in use respectively fail to fully satisfy high standard demanded for electronic parts, and thus, it is pointed out that conventional adhesive agents will not properly be applicable to high-density semiconductor module packages to be assembled in the future. Furthermore, since conventional reactive thermosetting resins including epoxy resin respectively need to be cured at a high temperature for a long duration, all of said resins are apt to induce failure of electric/electronic apparatuses, and thus, these resins are not suited for composing electric/ electronic parts. In addition, conventional reactive thermosetting resins respectively need a post-curing process that lasts for a long while. Consequently, in order to produce electric/elelctronic parts to be mounted on FPCs with high density, provision of higher-performance adhesive agent has been demanded.

Recently, semiconductor modules incorporating a variety of LOC structures or COL structures have been developed. For example, the Japanese Laid-Open Patent Publication HEI-3-12781 discloses such a semiconductor module incorporating LOC structure. However, said Patent Publication merely describes that adhesive-agent layer is selected from epoxy resin, acrylic resin, silicone resin, or polyimide resin, without concrete exemplification. It is thus inferred that the above prior art merely uses any of conventionally known general-purpose adhesive agents without improving characteristic of adhesive-agent layer.

On the other hand, fluorocarbon resin such as FEP has widely been used as one of thermoplastic resins for providing adhesive property. However, because of extremely poor resistivity against radioactive rays, fluorocarbon resin is not suited for specific uses requiring resistivity against radioactive rays. Under the above circumstances, an early development of novel film incorporating distinct resistivity against radioactive rays and chemicals, distinct characteristic under low temperature, distinct adhesive property, and distinct thermally fusible adhesive property with satisfactory dielectric characteristic and lower water-absorbent property, has long been desired. In the case of fabricating such a tubular film made from polyimide resin applicable to a variety of uses such as FPCs, cable insulation film, medical instruments, or the like, normally, edges of produced film are superposed by cylindrically folding it, and then edges are adhered with adhesive agent to make up tubular form. However, due to restrictive factor in the process of producing polyimide film via casting method, polyimide film is expensive, and yet, juncture remains on the film. In addition, when adhesion is improperly effected or adhesive agent generates degradation, film edges are disengageable along juncture to raise a problem. In particular, when using adhesive agent, resistivity of polyimide film against heat and chemicals is restricted by characteristic of adhesive agent to result in the failure to fully exert proper characteristic of polyimide resin.

Recently, in conjunction with development of elementary particle physics, construction of such an accelerator for generating extremely high energy has been underway. In order to generate such extremely high energy, provision of magnets capable of generating intense magnetism by feeding huge current is essential. As a recent trend, there are increasing cases in which superconductive magnets using superconductive wires are introduced.

To compose superconductive wires, in many cases, oxide mainly comprising copper is used. However, when using adhesive agent made from thermosetting resin in the course of covering superconductive wires with insulation cover material, thermal treatment causes rate of oxidizing superconductive wires to vary to result in the degraded characteristic of magnets. Accordingly, it is essential for the above process that such an adhesive agent capable of curing and properly achieving adhesion under low temperature be used.

Because of operating characteristic, the above accelerator generates a huge volume of radioactive rays. In order to more effectively utilize magnetism, recently, superconductive magnets are set up at a location closer to tubes for transferring elementary particles, and consequently, superconductive magnets are readily affected by radioactive rays. Accordingly, it is essential that distinguished resistivity against radioactive rays be provided for insulation cover material and adhesive agent used for superconductive magnets.

For covering superconductive wires under extremely low temperature, laminate of thermosetting resin mainly comprising epoxy resin built on polyimide film has been used. However, since curing of epoxy resin requires high-temperature treatment for a long period of time, superconductive wires are subject to deterioration. On the other hand, since epoxy resin does not exert sufficient resistivity against radioactive rays, and yet, in anticipation of further increase in the volume of radioactive rays to be generated in conjunction with further growth of energy to be emitted from accelerators, provision of novel adhesive agent capable of achieving adhesion at low temperature and exerting distinct resistivity against radioactive rays has been demanded.

In order to store extremely low-temperature material such as liquefied helium, conventionally, such a container comprising double-wall structure consisting of an inner vessel and an outer vessel interspaced via vacuum filled with insulation material has been used. To make up insulation material, such a laminate sheet comprising a reflection film comprising a polyester film or a polyimide film having a single surface or both surfaces being adhered with an aluminium foil(s) or adhered with evaporated aluminium and a spacer comprising a glass-fiber cloth or net composed of plastic yarns such as polyester yarns has been used.

However, recently, in conjunction with rapid progress in the art of utilizing extremely low temperature requiring liquefied helium and in the art of utilizing superconductor, form of refrigerated objects has been complicated, and yet, space for setting laminated insulation material tends to be contracted. In addition to thermal insulation property, a variety of characteristics are required for insulation material to be used. For instance, in the field of nuclear fusion or an accelerator, in order to generate intense magnetism, use of superconductive magnets is essential, and thus, strength and resistivity against radioactive rays are required for such insulation material. Nevertheless, when using general-purpose resins such as polyester resin for forming reflection films, the film for making up laminated insulation material is affected by irradiated radioactive rays to incur degradation and deformation to result in the failure to hold sufficient thermal insulation property. Furthermore, since effect of refrigerating agent is lowered when impurities such as water absorbed in the insulation material intermix with refrigerating agent such as liquefied helium, the insulation material is previously heated to remove impurities via evaporation. However, since polyester film is poor in thermal resistant property, it cannot be treated with sufficient high temperature, thus raising problems such as prolonged duration of thermal treatment and residue of impurities remaining thereon.

In the case of using such a film incorporating satisfactory thermal resistant property and resistivity against radioactive rays made from curable polyimide film ("APICAL", a product and a registered trade name of Kanegafuchi Chemical Industrial Co., Ltd.) for example for the above reflection plastic film, since the curable polyimide film itself is devoid of adhesive property, use of adhesive agent is required. Accordingly, own performance characteristic is affected by adhesive agent to be used, and yet, since there is no adhesive agent having distinct thermal resistance property and resistivity against radioactive rays, only negligible effect is yielded from the use of polyimide film.

In the course of covering superconductive wires, the wires can be prevented from incurring degradation by using such an adhesive agent composed of low-temperature-curable polyimide resin as the one capable of achieving adhesion at low temperature and being distinct in resistivity against radioactive rays. However, in this case, since curing effect under normal temperature can be promoted at a relatively fast rate, shell life of adhesive agent in stage B is short. This in turn prevents said curable polyimide film in the form of a laminated film from being offered to marketable end uses.

Likewise, in conjunction with development of a variety of electronic apparatuses, enhancement of performance characteristic has also been required for capacitors built in them. Normally, general-purpose resins such as polyethylene resin or polypropylene resin are used for composing dielectric film of plastic capacitors. However, any of said general-purpose resins have proved to be poor in thermal resistant property, and accordingly, any of conventional capacitors using general-purpose resins is poor in thermal resistant property to result in the limited uses.

To cope with the above-described circumstances by way of facilitating development of thermally fusible adhesive laminate films for covering wires, materials for composing novel adhesive agent applicable to electronic modules such as reflection film of laminated insulation material and dielectric film for composing capacitors, and yet, in order to properly deal with a variety of uses in other fields, development of novel film and tube featuring easy processability, enhanced thermal resistant property, enhanced chemical resistant property, and reliable adhesive property, has been longed for.

As one of practical methods for solving problems existing in the above-described fields, there is a proposal for polyimide resin incorporating aliphatic radical as applicable to film material having thermal adhesive property. The proposed polyimide resin is inexpensive, and yet, contains practical softening temperature, satisfactory thermal fusible adhesive property, thermal resistant property, and satisfactory chemical resistant property. On the other hand, since molecular weight of polymer is extremely low, the film is devoid of self-supporting property to merely yield fragile structure thereof. Consequently, it is quite difficult to strip the film off from a support body in the course of the casting process. Conversely, while executing an imidizing process by sufficiently heating the film on a support body, the film tightly adheres to the support body to make it impossible to peel both from each other, and thus, the proposed polyimide could hardly be used for the above purpose.

On the other hand, among aromatic polyimide films, non-thermoplastic imide resin and thermosetting imide resin are generally insoluble and infusible, and thus, processing cannot be executed in the form of polyimide. Even in the case of thermoplastic imide resin, because of high viscosity of fused resin, it is necessary to make use of a specific molding machine using high processing temperature. For example, molding temperature of polyether imide ("ULTEM", a product and a registered trade name of GE Japan, Ltd.) is extremely high as it ranges from 340° C. to 425° C. Accordingly, this polyether imide cannot be molded by applying any conventional molding machine, and thus, a specially designed molding machine using high molding temperature is needed. As another processing method, like the case of processing non-thermoplastic imide resin, as mentioned earlier, generally, a thin film is formed from solution of polyamide acid being a precursor of polyimide via a casting process followed by a drying process and an imidizing process to generate a film. Nevertheless, because of high water-absorbent property of this film, there are merely limited uses as a disadvantageous factor thereof.

Recently, there is a proposal on an example of using a polyimide insulation adhesive agent applicable to a copper-coated laminate sheet usable for base film or cover-lay film of said FPC board. For example, according to Japanese Laid-Open Patent Publication HEI-2-138789, a proposal was presented on a method of manufacturing an FPC board for adhering a copper foil to a substrate comprising a polyimide film by using an adhesive film yielded from resinous composition comprising a mixture of aromatic polyimide yielded from 3'3,4'4-benzophenontetracarbonic acid dianhydride and aromatic diamine and polymaleimide. Japanese Laid-Open Patent Publications HEI-5-179224 and HEI-5-112768 respectively made proposals on a variety of adhesive materials made from thermoplastic polyimide resin capable of achieving adhesion via a thermal treatment and a pressing process. Furthermore, recently, even in the field of electronic module, polyimide adhesive agent exerting satisfactory thermal resistant property has been developed.

Any of the above-referred polyimide adhesive agents have proved to be satisfactory in fluidity in the molten condition, exhibited distinct adhesive property via thermo-compression bonding, and yet, proved to be distinctly satisfactory in thermal resistant property to make it possible to fully exert characteristic of polyimide film used for the base film of flexible printed circuit boards. However, the above-referred polyimide adhesive agents respectively have proved to generate a problem that adhesion could not be achieved unless being treated with a heating process using a minimum of 300° C.

Furthermore, the above-referred polyimide adhesive agents respectively have proved that these adhesive agents readily absorbed moisture from atmospheric water to result in degraded electric characteristic during storage, and thus they could hardly be stored as of polyimide condition. Accordingly, any of the above-referred polyimide adhesive agents could not be supplied in the state of adhesive film sheet, and consequently, when being used for adhesive agent, solution of polyamide acid being a precursor thereof is initially applied onto an insulation film which is used for the base film or the cover-lay film via a coating process, and then, after being dried, coated polyamide acid is thermally imidized before eventually forming a layer of adhesive agent. Since the above complex processes are needed, a novel method for simplifying production of flexible printed circuit boards has been sought.

In the course of producing semiconductor modules, semiconductor chips may be subject to defect by effect of a heating process on the way of adhesion to result in the lowered productivity. Furthermore, since the layer of adhesive agent absorbs moisture, water is evaporated by heat generated by a soldering process to cause packages to generate crack or burst, and thus, any of conventional adhesive agents cannot readily be used for semiconductor modules. There are such cases in which a layer of adhesive agent absorbs water in the course of manufacturing flexible printed circuit boards to result in the lowered electric characteristic of the adhesive-agent layer, thus eventually deteriorating quality of final products.

Japanese Laid-Open Patent Publications HEI-6-261217 and HEI-6-291152 respectively have disclosed a lead-frame usable for semiconductor modules, which respectively describe that thermoplastic polyimide is used for composing a layer of adhesive agent. Nevertheless, it is inferred that the thermoplastic polyimide specified in said inventions is conventionally known. According to Japanese Laid-Open Patent Publication HEI-6-261217, it is arranged to eliminate influence of remaining distortion caused by heat even though high temperature is necessarily applied to effect adhesion by way of matching thermal expansion coefficients of respective component materials when being built in a package structure. According to Japanese Laid Open Patent Publication HEI-6-291152, a layer of adhesive agent is formed by laminating thermoplastic polyimide and thermoplastic polyether amide imide to cause thermoplastic polyether amide imide to be melted to effect adhesion of a semiconductor chip to the layer of adhesive agent.

However, insofar as such a conventionally known adhesive agent is used, packages cannot be prevented from incurring crack in all cases to result in the failure to fundamentally improve reliability of semiconductor modules. Accordingly, trouble-free material for composing adhesive agent like the one having distinct thermal fusible adhesive property, satisfactory adhesion, least water-absorbent property, and being free from incurring crack to packages, has also been demanded for application to electronic modules.

In the structure of plastic capacitors, thermally resistant resinous film such as polyimide film is used for specific portion where distinct thermal resistant property is essentially required. Nevertheless, since conventional polyimide film is insoluble, infusible, and poor in processability, electrodes are formed via a sputtering process, or metallic electrodes are coated with polyamide acid being a precursor of polyimide, and then coated object is imidized to complete the process. Since complex facilities are needed to implement the above process, and yet, toxic gas is generated, specific facilities to purify toxic gas are needed, thus lacking in simplicity. And yet, since conventional polyimide film absorbs atmospheric water at a high rate, dielectric constant is variable, thus lowering reliability thereof.

In order to fully solve the above problems by way of presenting novel thermally-resistant thermoplastic resin and a variety of materials made from said novel resin being advantageous to effect presentation of tubular films, insulating materials, metallic-wire-covering materials, materials for electronic-circuit parts facilitating expansion of environment in which electronic apparatuses are usable, inventors have followed up overall studies and experiments and eventually found novel copolymer featuring distinct properties in terms of mechanical strength, resistivity against radioactive rays, chemical resistant property, stable characteristic under low temperature, thermal resistant property, processability, adhesive property, and stable thermal adhesive property simultaneously satisfying low hygroscopic characteristic and stable dielectric constant, and accordingly, concrete concept on film, powder particles, thermal fusible adhesive film for covering wires, laminated insulation material, electronic modules, and capacitors, has been consummated by way of applying novel thermoplastic polyimide resin mainly comprising said novel copolymer so that a variety of existing problems can fully be solved by effectively utilizing the above distinct physical properties.

DISCLOSURE OF THE INVENTION

A subject of a novel copolymer incorporating thermal fusible adhesive property according to the present invention is that said novel copolymer conjunctionally incorporates a glass transition point in a range from 100° C. to a maximum of 250° C., 1% or less than 1% of hygroscopic degree, and 3 or less than 3 of dielectric rate, and can be designated by general formula (1);

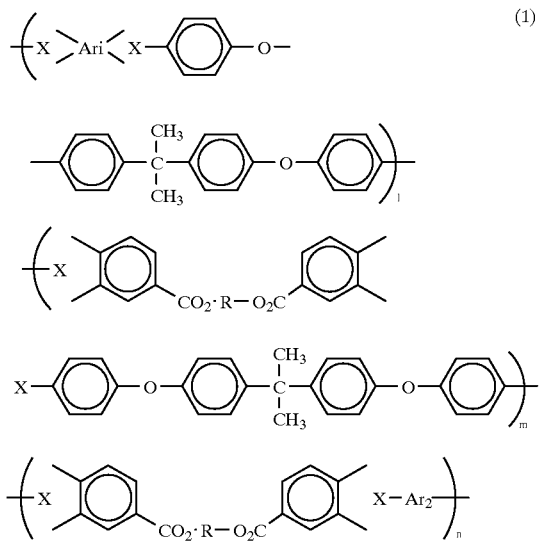

in which $Ar_1$ designates a quadrivalent organic radical, $Ar_2$ designates a divalent organic radical, and R designates a divalent organic radical selected from

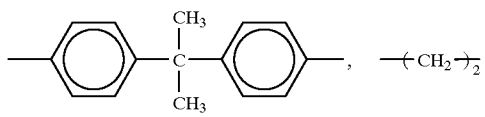

whereas X designates a trivalent bonding radical selected from

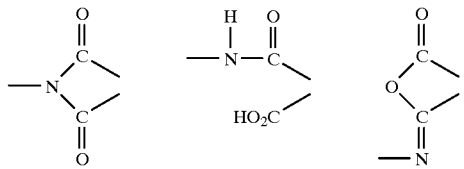

in which m and n are respectively integer of 0 or 1 or more than 1, and sum of m and n is 1 or more than 1, whereas 1 designates integer of 1 or more than 1.

A subject of a novel copolymer incorporating thermal fusible adhesive property according to the present invention is that said novel copolymer, wherein said $Ar_1$ shown in said general formula (1) is at least one kind selected from a group of quadrivalent organic radicals shown in the following formula.

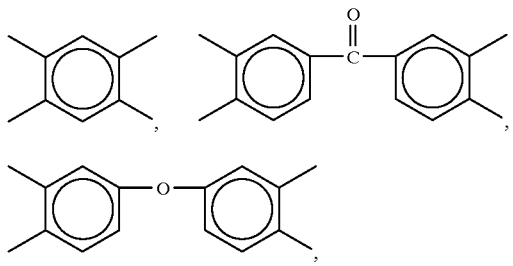

-continued

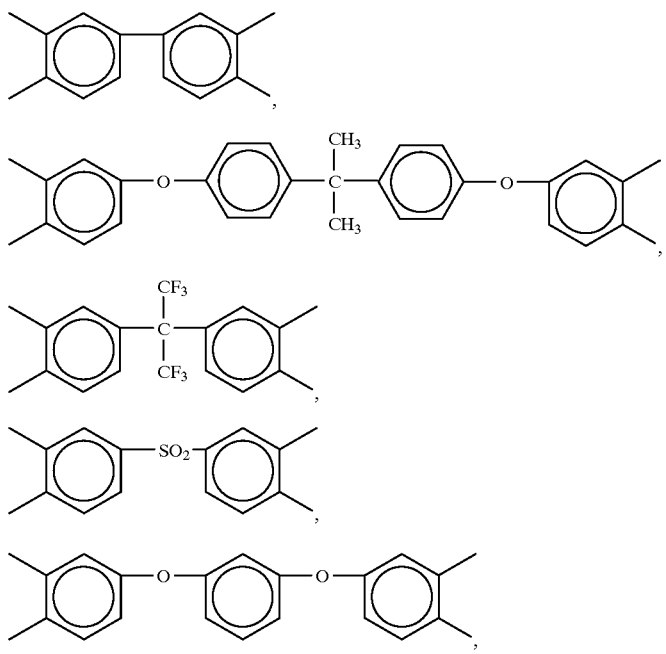

A subject of a novel copolymer incorporating thermal fusible adhesive property according to the present invention is that said novel copolymer, wherein said $Ar_2$ shown in said general formula (1) is at least one kind selected from a group of divalent organic radicals shown in the following formula;

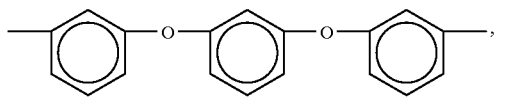

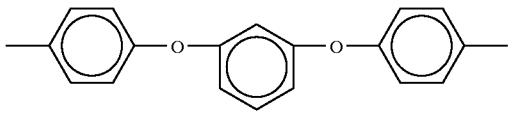

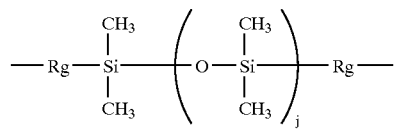

in which Rg designates methyl radical, ethyl radical, propyl radical, butyl radical, pentyl radical, and phenyl radical, whereas j designates integer of 1 through 10:

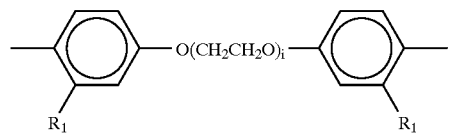

in which Rf designates hydrogen and methyl radical, whereas i designates integer of 1 through 4.

A subject of a novel copolymer incorporating thermal fusible adhesive property according to the present invention is that said novel copolymer comprises at least one or more than one kind of acid dianhydride designated by the following formula

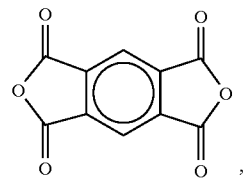

-continued

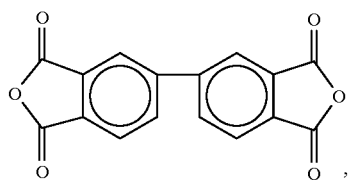

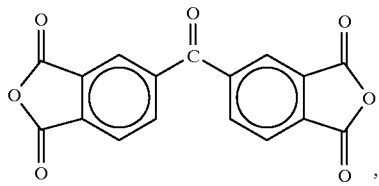

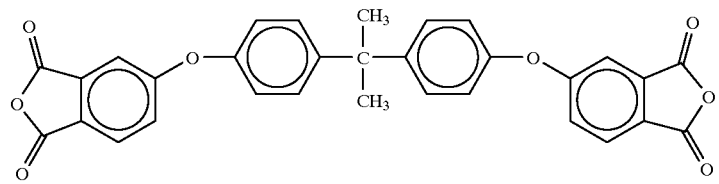

and at least one or more than one kind of diamine designated by the following formula.

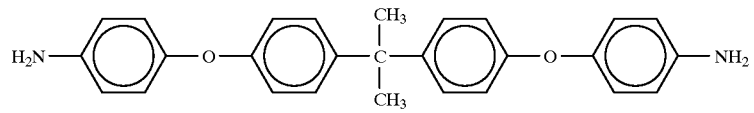

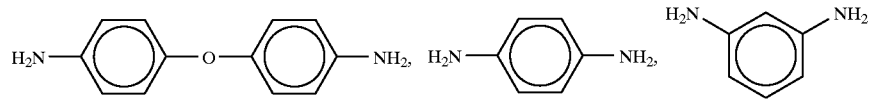

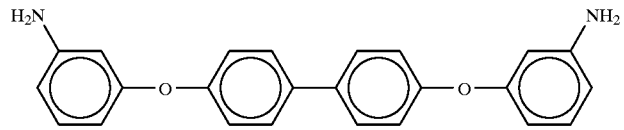

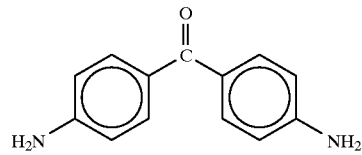

A subject of powder particles is that thermoplastic polyimide resin mainly comprising said novel copolymer containing thermal fusible adhesive property is formed in powder particles.

A subject of a film according to the present invention is that thermoplastic polyimide resin mainly comprising said novel copolymer containing thermal fusible adhesive property is formed in film.

A subject of a film according to the present invention is that thermoplastic polyimide resin mainly comprising novel copolymer containing thermal fusible adhesive property is formed in tube.

A subject of a method of manufacturing said film comprises sequential steps of; a process to fully dry thermoplastic polyimide resin mainly comprising novel copolymer containing thermal fusible adhesive property, a process to charge said fully dried resin in a melting/extruding machine, and a final process to mold said resin into tubular form via melt-extrusion method.

Further subject of a film according to the present invention comprises a base-film layer made from thermally resistant resin and a thermal fusible adhesive layer made from thermoplastic polyimide resin mainly comprising said novel copolymer containing thermal fusible adhesive property Further subject of a film according to the present invention is said film comprising a film layer made from said thermoplastic polyimide resin mainly comprising novel copolymer containing thermal fusible adhesive property and a conductive layer comprising electrical conductor.

Further subject of a film according to the present invention is said film comprising a base-film layer made from thermally resistant resin, an intermediate layer made from said thermoplastic polyimide resin mainly comprising novel copolymer containing thermal fusible adhesive property and a conductive layer comprising an electrical conductor.

A subject of a laminated heat insulating material according to the present invention is that said laminated heat insulating material comprises reflection film s having metal layers being formed on one surface, both surfaces or the inside of film made from thermoplastic polyimide resin mainly comprising novel copolymer containing thermally fusible adhesive property and net-form spacers composed of plastic yarns so that reflection films adjacent to said spacers will not come into direct contact with each other.

A subject of a laminated heat insulating material according to the present invention is that said laminated heat insulating material, wherein said spacers respectively are composed of textile fabric or knit comprising plastic yarns each having a maximum of 50 deniers of thickness.

Further, a subject of a laminated heat insulating material according to the present invention is that said laminated heat insulating material, wherein said reflection films are respectively yielded by that simultaneously or sequentially on one surface or both surfaces of each metal foil, melt substance or solution of thermoplastic polyimide resin mainly comprising novel copolymer containing thermally fusible adhesive property is formed in film and said film is cured.

Further, a subject of a laminated heat insulating material according to the present invention is that said laminated heat insulating material, wherein said reflection films are respectively yielded by that simultaneously or sequentially on one surface or both surfaces of each metal foil, solution of a precursor of thermoplastic polyimide resin mainly comprising novel copolymer containing thermally fusible adhesive property is formed in film, and said film is dried and thereafter imidized.

Further, a subject of a method of manufacturing the laminated heat insulating material comprises a step of alternately laminating said reflection films and said net-form spacers and a step of integrally adhering them by adhesive effect of said thermoplastic polyimide resin.

In addition, a subject of a method of manufacturing the laminated heat insulating material comprises a step of alternately laminating said reflection films and said net-form spacers and a step of integrally sewing both of them.

In addition, a subject of an electronic module according to the present invention comprises a lead frame and an electronic element at least directly or indirectly being connected to each other via an adhesive agent layer, said electronic module is sealed by means of resin except for a part of said lead frame, said adhesive agent layer is composed of thermoplastic polyimide resin mainly comprising said novel copolymer.

Next, a subject of a capacitor according to the present invention comprises a dielectric layer composed of thermoplastic polyimide resin mainly comprising novel copolymer containing thermal fusible adhesive property.

BRIEF DESCRIPTION OF THE DRAWINGS

FIG. 4 (a) and (b) are cross-sectional views for explanatory of further methods of covering wires with laminated films; wherein FIG. 4(a) illustrates covering processes and FIG. 4(b) the state after completing the covering process;

FIG. 5 is a perspective view of an exemplified laminated insulating material related to the invention;

FIG. 6, 7, and 8 are respectively enlarged cross-sectional views of an exemplified reflection film used for the laminated insulating material related to the invention;

OPTIMAL FORM FOR EMBODYING THE INVENTION

Figure 1:
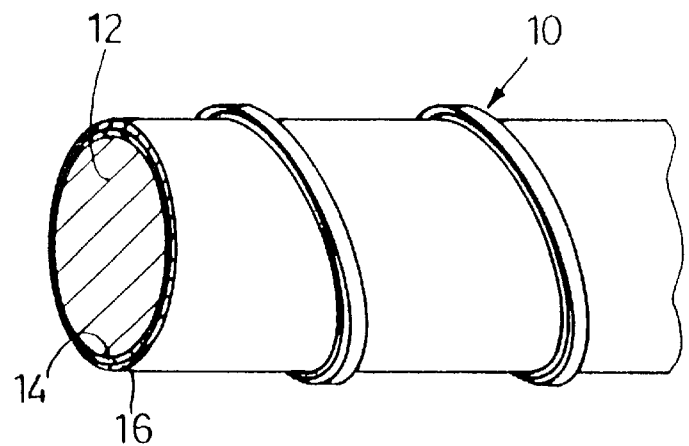
FIG. 1, 2 and 3 are respectively perspective views for explanatory of methods of covering wires with novel laminate films related to the invention.

The novel copolymer incorporating thermal fusible adhesive property related to the invention conjunctionally incorporates distinguished thermal resistant property, processability, low hygroscopic characteristic and least dielectric constant. The novel copolymer has a distinctly identifiable glass transition point between 100° C. and 250° C., and thus, by way of applying a process at a certain temperature close to the glass transition point, the novel copolymer can securely be adhered onto a variety of objects such as polyimide film, metal such as copper foil, and a flexible printed circuit board, for example, after being formed into a film or a tubular film or by executing a laminating process. Accordingly, as optimal material for composing films, flexible copper-coated laminated boards, thermally adhesive laminated films for covering wires, laminated insulation material, electronic modules and capacitors, the novel copolymer or copolymerized powder particles related to the invention can fully exhibit the above-described distinguished physical properties in a variety of industrial fields.

More particularly, the thermal fusible adhesive copolymer related to the invention is represented by General Formula (1) shown below,

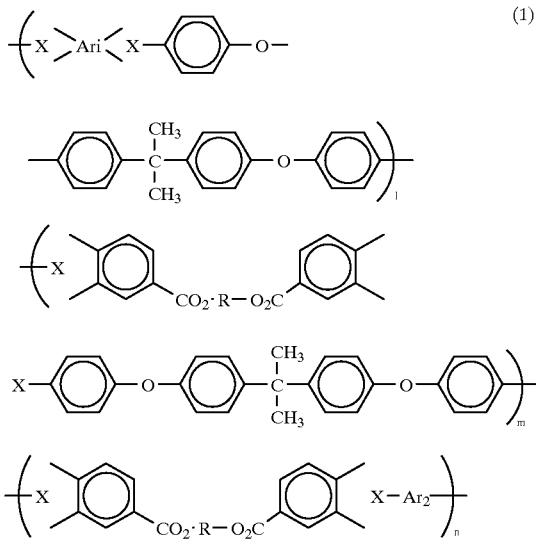

(1)

in which $Ar_1$ represents a quadrivalent organic radical, $Ar_2$ a divalent organic radical, R a divalent organic radical selected from the constitutional formulas just shown below,

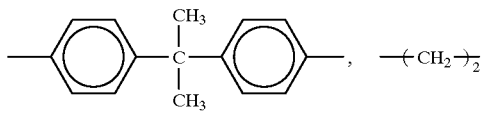

and X represents a trivalent bonding radical selected from another constitutional formulas just shown below.

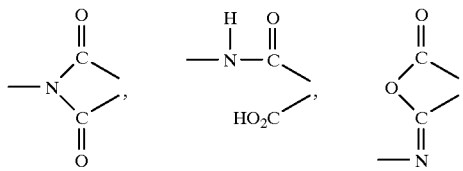

Small letters m and n respectively represent 0 or 1 or integer of more than 1, and the sum of m and n is 1 or more than 1, whereas l represents integer of 1 or more than 1.

The novel copolymer incorporates a glass transition point in a range from 100° C. to 250° C. and exhibits extremely low hygroscopic characteristic being a maximum of 1% after being immersed in pure water (20° C.) for 24 consecutive hours. The novel copolymer exhibits extremely low dielectric characteristic as it proved to be a maximum of 3 of dielectric constant at 1 MHz frequency via a Q-meter test. By virtue of extremely low hygroscopic characteristic and minimal dielectric constant, the novel copolymer can suitably be used for such materials for composing electronic-circuit parts suited for implementing loading thereof under higher density in the future.

Next, practical form of implementing the invention is described below. Initially, method of producing the novel copolymer related to the invention is described below. The novel copolymer is produced via copolymer of polyamide acid being a precursor thereof. Thus, a method of producing copolymer of polyamide acid being a precursor of the novel copolymer is described below.

Copolymer of polyamide acid can be yielded by causing acid dianhydride to generate reaction against diamine component in organic solvent. When implementing the invention, initially, diamine represented by General Formula (2) is dissolved or diffused in organic solvent in inert-gas environment filled with argon or nitrogen.

 General Formula (2)

in which $Ar_2$ represents a divalent organic radical. Next, the yielded diamine solution is added with one or two kinds of ester acid dianhydride represented by General Formula (3) shown below

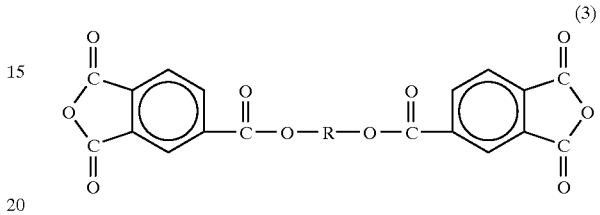

(3)

(in which R is selected from a group of divalent organic radicals shown in constitutional formulas just shown below)

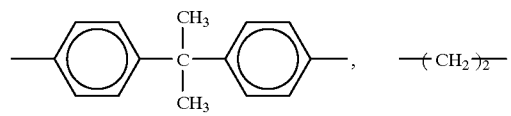

or the yielded diamine solution is added with mixture of said ester-acid dianhydride and one or plural kinds of organic tetracarbonic-acid dianhydride represented by General Formula (4) shown below

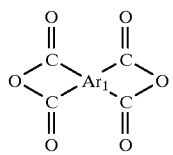

(4)

(in which $Ar_1$ represents a quardrivalent organic radical) as of solid state or in the form of solution of organic solvent. Consequently, solution of polyamide acid being a precursor of polyimide is yielded. In the course of generating the above-referred reaction, in the way inverse from the above-described addition sequence, it is also permissible to initially prepare only dianhydride of ester acid or solution of mixture of said ester-acid dianhydride and organic tetracarbonic acid followed by addition of solid diamine or solution of diamine dissolved in organic solvent or slurry to the above solution. It is desired that the reaction be effected under temperature ranging from −10° C. to 50° C., more desirably, in a range from −5° C. to 20° C. Reaction is effected for a period ranging from a half hour to 3 hours to generate polyamide acid being a precursor of thermoplastic polyimide.

In order to produce polyimide from solution of polyamide acid being a precursor thereof in the following step, thermal and/or chemical dehydration/cycle-closing (imidizing) process is applicable.

In the case of executing the thermal imidizing process, solution of the above-referred polyamide acid is formed into film by effect of flowing or coating of said solution on a support sheet or an organic film such as PET, or a support body such as a drum or an endless belt, and then, after evaporating organic solvent, a stable film having self-supporting characteristic is produced. It is desired that evaporation of organic solvent be executed at a temperature of 150° C. or below 150° C. for about 5 through 90 minutes. Next, yielded film is dried via a thermal treatment for imidization to complete production of the novel polyimide film comprising thermoplastic polyimide according to the invention. It is desired that the final thermal treatment be executed at a temperature ranging from 150° C. to 350° C., preferably in a range from 250° C. to a maximum of 300° C. Although temperature can be raised at any gradational rate, it is desired that temperature be gradually raised until reaching a maximum degree. Although heating duration varies according to film thickness and applicable maximum temperature, it is desired that heating be executed for a period ranging from 10 seconds to a maximum of 10 minutes after reaching a predetermined maximum temperature. When executing the imidizing process via thermal drying of the film having self-supporting characteristic, initially, the film is stripped off from a support body, and then, the film is heated with edges being secured, and consequently, copolymer featuring low linear expansion coefficient is produced.

When chemically executing a dehydration/cycle-closing (imidization) process, initially, dehydrate by an amount beyond stoichiometry and tertiary amine by an amount corresponding to catalytic amount are respectively added to the above-referred polyamide acid solution. Then, in the same way as was done for thermal dehydration process, the blend solution is thermally treated. Execution of the chemical imidization process generates the novel polyimide comprising thermoplastic polyimide related to the invention within a period shorter than the case of thermal dehydration.

A comparative test proves that the chemically imidized polyimide exhibits greater mechanical strength and less linear expansion coefficient than those of the thermally imidized polyimide.

In order to produce polyisoimide copolymer, initially, reactive material used for generating the above-described polyimide, i.e., diamine and tetracarbonic acid dianhydride are substituted with diimide such as dicyclocarbodiimide (DCC) and carbonic acid such as trifluoro acetic acid, and then, reaction identical to the case of producing the above-referred polyimide is executed.

A variety of ester-acid dianhydrides may be used to function as ester-acid dianhydride represented by the above-identified General formula (3) used for implementing the invention. However, more concretely, in order to properly Ialance a variety of physical characteristics, it is preferred that such an ester-acid dianhydride being a divalent organic radical shares majority of constituents in the above-identified General formula (3) in which R is selected from constitution formulas shown below.

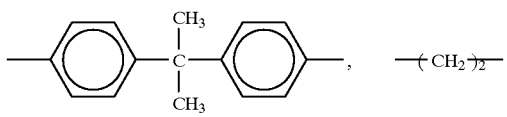

Such ester-acid dianhydride specified by R may be used in the form of one kind or a mixture of two kinds.

Essentially, organic tetracarbonic-acid dianhydride having a variety of structures can be used for functioning as the one represented by the above-identified General formula (4). However, it is preferred that such organic tetracarbonic-acid dianhydride being a quadrivalent organic radical be used, wherein $Ar_1$ shown in the above General formula (4) is substantially a quadrivalent organic radical containing aromatic radical. More concretely, it is preferred that said organic tetracarbonic-acid dianhydride being a quadrivalent organic radical enabling selection of the $Ar_1$ component from the constitutional formulas just shown below shares the majority of constituents.

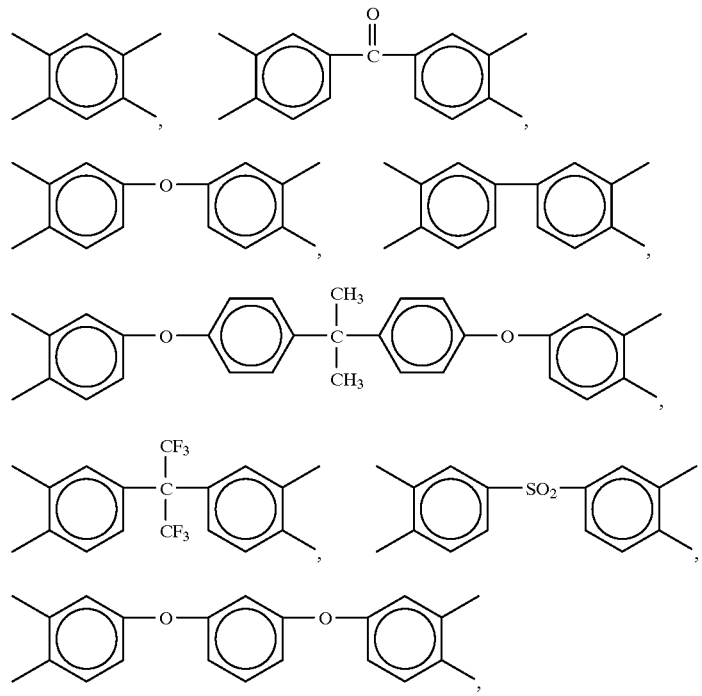

Such organic tetracarbonic-acid dianhydride specified by the above $Ar_1$ component may be used in the form of one kind or two or more than two kinds in mixture.

Essentially, a variety of diamines may be used to function as diamine compound represented by the above-identified General Formula (2). However, in order to properly balance a variety of physical characteristics, it is preferred that diamine substantially being a divalent organic radical shares the majority of constituents, wherein $Ar_2$ shown in the above General formula (2) is selected from the constitutional formulas just shown below.

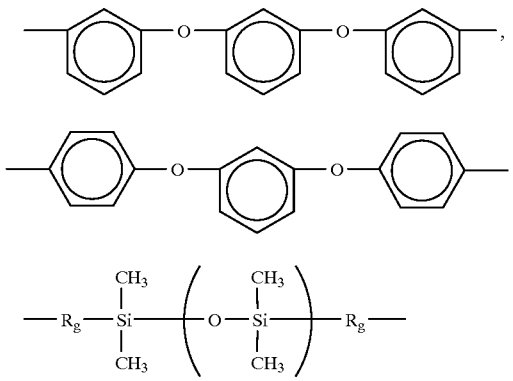

in which Rg designates methyl radical, ethyl radical, propyl radical, butyl radical, pentyl radical, and phenyl radical, whereas j designates integer of 1 through 10, respectively.

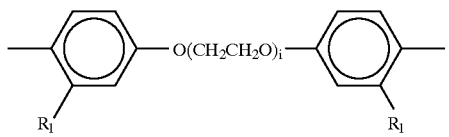

in which Rf designates hydrogen and methyl radical, whereas i designates integer of 1 through 4, respectively. Such diamine specified by the $Ar_2$ component may be used in the form of one kind or two or more than two kinds in mixture.

Next, block-unit repeat numbers "m" and "n" in novel copolymer incorporating thermally fusible adhesive property expressed by the above General formula (1) respectively designate integer of 0 or 1 or more than 1. In order to generate a glass transition point in a range from 100° C. to 250° C., 1% or less than 1% of low-hygroscopic degree and 3 or less than 3 of dielectric constant, sum of "m" and "n" must be 1 or more than 1. When "m" and "n" respectively exceed 15, copolymerization rate is biased to result in the lowered effect of copolymerization. Concretely, since the glass transition point tends to be too high, adhesive property under low temperature cannot easily be confirmed. Accordingly, it is desired that "m" and "n" be 15 or less than 15, respectively. In order to generate sufficient mechanical strength, repeat number designated by 1 must be integer of 1 or more than 1, which in turn contributes to provision of self-supporting characteristic for produced film. Although it is permissible that such units having different values of "m" and "n" may be present in each molecule of copolymer, it is desired that values of "m" and "n" be identical to each other. Copolymer is structured via repeat of the above block.

Although no restriction is applied to molecular weight of the above-referred copolymer in regard to novel aromatic polyimide incorporating thermally fusible adhesive property related to the invention and also in regard to aromatic polyamide acid being a precursor of said aromatic polyimide, in order to sustain proper strength of produced polyimide resin, it is desired that mean molecular weight be 50,000 or more than 50,000, furthermore in excess of 80,000, or particularly in excess of 100,000, and yet, preferably in excess of 120,000. It should be noted that, since it is quite difficult to directly measure molecular weight of polyimide, description on the molecular weight in the present invention is based on inference drawn from values measured via indirect measuring method. Concretely, in the present invention, based on measured values of molecular weight of polyamide acid being a precursor of the novel aromatic polyimide, molecular weight of the polyamide acid is converted into the molecular weight of said polyimide, thereby the converted value is regarded as molecular weight of said polyimide.

A variety of organic solvents are applicable to reaction needed for generating polyamide acid, for example, including the following; sulfoxide solvent such as dimethyl sulfoxide or diethyl sulfoxide, formamide solvent such as N, N'-dimethylformaldehyde or N,N'-diethylformaldehyde, or acetoamide solvent such as N,N'-dimethyl acetoamide or N,N'-diethyl acetoamide, or the like. Any of the above-cited organic solvents may be used on the single basis or in the mixed form comprising 2 or 3 kinds thereof. In addition, such a blend solvent comprising any of said polar solvents and non-solvent of polyamide acid may also be used. Non-solvents of polyamide acid include acetone, methanol, ethanol, isopropanol, benzene, methyl cellosolve, or the like.

It is desired that any of the following tertiary amines including pyridine, α-picoline, β-picoline, γ-picoline, trimethylamine, triethylamine or isoquinoline be used to function as catalyzer.

The novel aromatic copolymer incorporating thermal fusible adhesive property produced via the above-described production method according to the invention is characterized by conjunctional provision of distinct thermal resistant property, distinct thermoplasticity, distinct adhesive property, extremely low hygroscopic characteristic and extremely low dielectric constant. Although mechanism for exhibiting extremely low hygroscopic characteristic and extremely low dielectric constant is not yet clarified, it is inferred that biasing of electrons is minimized by effect of an ester radical close to pentacyclicimide.

Next, powder particles comprising copolymer incorporating thermal fusible adhesive property according to the present invention can be obtained by that through thermally and/or chemically imidizing process, polyamide acid solution being a precursor of the above-identified polyimide is formed into film, which is then imidized and ground into powder particles.

When executing the thermally imidizing process as another practical method of producing powder particles comprising novel copolymer characteristically containing thermal fusible adhesive property, after being added with dehydrant by such an amount exceeding stoichiometry, temperature of polyamide-acid solution is raised and then solution is stirred. After being aged, powder particles complete with the imidizing process are precipitated. After a drying process, desired polyimide powder particles are produced. When executing the chemically imidizing process, dehydrant by such an amount beyond stoichiometry and tertiary amine corresponding to catalytic amount are added to the above-referred solution comprising polyamide-acid polymer, and then, after being stirred at room temperature for several hours, the compound solution is dripped onto a lean solvent such as methanol or water. After being extracted in the state of yarns or lump, yielded compound is dried and ground into desired polyimide powder particles. Furthermore, by effect of blending thermoplastic resin and filler such as nylon, polyvinyl acetate, polyvinyl chloride, polytetrafluoroethylene, or polymethacrylic-acid methyl, with the novel copolymer uniquely incorporating thermal fusible adhesive property, it is possible to produce resin composition mainly comprising the novel copolymer incorporating improved physical characteristics such as mechanical strength and adhesive property. Powder particles according to the present invention can be obtained by the resin composition.

Powder particles comprising the novel copolymer incorporating distinct thermal fusible adhesive property produced by executing the above described method are characterized by conjunctional provision of distinguished thermal resistant property, thermoplasticity, adhesive property, and extremely low hygroscopic characteristic and extremely low dielectric constant. According to conventional method of producing conventional polyimide film described earlier, because of the nature of the conventional production method, there is a limit in the scope of film thickness merely being ranged from 200 $\mu$m to 300 $\mu$m at the most. On the other hand, according to the invention, film having a thicker thickness can easily be produced by way of molding copolymer powder particles related to the invention via an extrusion process. Like the film produced via conventional film forming process, the inventive polyimide film incorporating a variety of physical characteristics of the above-described thermal fusible adhesive copolymer is ideally suited for producing cover-lay adhesive agent, flexible printed circuit boards, laminated insulation film for covering superconductor wires, bonding sheets, or the like. In addition, the inventive polyimide film is also effectively usable for producing sealing material and substrates. The novel polyimide film is also ideally suited for covering tubes, catheter, stationary rollers, O-rings, bearing shafts, or the like. However, in so far as the novel polyimide film can effectively exert proper characteristics such as mechanical strength, resistivity against radioactive rays, chemical resistant property, low-temperature characteristic, thermal resistant property, processability, adhesive property, low hygroscopic property, and low dielectric constant, there is no limit in the potential use thereof.

The novel polyimide film mainly comprising copolymer produced by executing the above-described method not only incorporates the above-referred advantageous physical properties, but it also incorporates characteristic of the above novel copolymer in terms of glass transition point ranging from 100° C. to 250° C. Accordingly, because of outstanding mechanical strength, particularly because of adhesive property with substantial peeling strength, the novel polyimide film is optimally suited for composing adhesive agent. In addition, because of lower glass transition point than that of conventional polyimide films, adhesion can be effected under low temperature, and thus, the novel polyimide film is free from causing quality of electronic parts and superconductor wire to be deteriorated by heated effect otherwise being incidental to conventional resin products. Furthermore, because of outstanding thermal resistant property, there is no fear of an adhesive agent layer itself to be deteriorated and inducing failure of electric/electronic parts. Accordingly, the novel polyimide film can be used for composing tubular film and laminated film available for electronic parts, and laminated insulation film for covering wires used for accelerators. In addition, because of own adhesive property, the novel film can easily adhere to resin or metal. For example, when being used for covering wires, owing to negligible dielectric constant being less than 3, when current is fed to wires, dielectric loss is minimized. In other words, the novel polyimide film can effectively suppress wires from being heated, thus enabling magnets to prevent themselves from being quenched, in other words, prevent themselves from incurring destruction of superconductive state otherwise caused by generation of heat. In addition, even when being used for composing flexible copper-coated laminate sheets, the novel polyimide is durable to post-curing process, thus optimally being suited therefor. Furthermore, owing to extremely low hygroscopic property, since the novel polyimide film is substantially devoid of hygroscopic property otherwise causing packages to incur crack or damage, the film is ideally suited for composing layer of adhesive agent on semiconductor modules. Moreover, owing to provision of chemical resistant property, resistivity to radioactive rays, and low-temperature characteristic, the novel polyimide film can sustain own insulation property in the field of nuclear fusion and accelerators as a useful insulation material without generating deterioration and deformation of said film.

In addition to provision of own thermal resistant property, since the novel polyimide film incorporates distinguished dielectric characteristic, it is ideally suited for making up a capacitor film. Concretely, in contrast with a conventional curable polyimide film such as "APICAL" series (a product and a registered trade name of Kanegafuchi Chemical Industrial Co., Ltd.) exhibiting 3.2 to 3.3 of dielectric constant, the novel polyimide film comprising novel copolymer incorporating thermal fusible adhesive property exhibits 3 or less than 3 of dielectric constant at 1 MHz of frequency when being tested via Q-meter method, thus minimizing dielectric loss. Accordingly, the novel film can suppress generation of heat in such fields being exposed to intense magnetism caused by use of superconductive magnets built in accelerators and nuclear-fusion furnaces for example, thus ideally being suited for application thereto. In addition, owing to minimum dielectric constant, by way of adding specific material to the novel copolymer, it is possible to produce specific dielectric incorporating optional dielectric constant, and thus, the novel copolymer can most suitably be used for composing dielectric of capacitors. There is no limit in the use of the novel film in a variety of fields utilizing the above-described advantageous characteristic thereof. The above-described Q-meter method indicates a specific method of rating dielectric constant based on JIS-C6481 specification. Furthermore, it is also possible to produce tubular films from thermoplastic polyimide resin mainly comprising the above-described novel copolymer incorporating thermal fusible adhesive property.

More particularly, the above-referred tubular film can be produced by executing the following processes. Initially, said thermoplastic polyimide resin mainly comprising the novel copolymer incorporating thermal fusible adhesive property and 100° C. to 250° C. of glass transition point expressed by the above-identified General Formula (1) is placed in a melting/extruding machine, and then, said resin is heated at a temperature above the glass transition point and thermally melted. Finally, melted resin is extruded in tubular form. Accordingly, the tubularly formed polyimide film is devoid of juncture to enable a variety of proper characteristics of the novel thermal fusible adhesive copolymer to be exerted to full extent, and thus, it is possible to produce tubularly formed films featuring superior dimensional precision and thickness precision at inexpensive cost. In addition, by way of using fully-dried novel copolymer incorporating thermal fusible adhesive property in the process of producing tubular films, foam caused by decomposition or lowered fluidity of thermoplastic resin can be prevented from occurrence to result in the production of tubular films distinct in dimensional precision and thickness precision.

The novel copolymer incorporating thermal fusible adhesive property used for production of the above-referred tubular films may be used on the individual basis. However, in order to promote thermal conductivity, the novel copolymer may be mixed with inorganic filler such as conductive carbon, talc, titanic-acid whisker or boron nitride, for example. Available inorganic fillers are not limited to those which are exemplified above. Provided that advantageous characteristics of the novel copolymer incorporating thermal fusible adhesive property are not noticeably being deteriorated, any material other than stabilizer, smoothing agent, surfactant, pigments, and polyimide resins, may be added to the novel copolymer. Kind of addable materials is not restricted in particular.

Method for continuously molding lengthy endless objects such as a film, a sheet or a pipe, features extremely high molding capability and economy when being applied to a melting/extruding process for the formation of resin into a tubular film. Concretely, solid thermoplastic polyimide resin such as film or powder particles for example is thermally melted inside of a heated cylinder (barrel) at a temperature above melting point of the resin, and then, while forming a predetermined shape with a die at the tip of the cylinder, shaped resin is extruded by a screw, and finally, the extruded resin is cooled with water or air to be solidified. Depending on the form of the die, a variety of molded products having a variety of sectional forms can be produced. Any of those conventional melting/extruding machines that can easily be known by those skilled in the art may be used.

As mentioned above, of those films according to the invention, because of low viscosity of molten resin, the above-referred tubularly formed film made from thermoplastic polyimide resin mainly composed of the novel copolymer incorporating thermal fusible adhesive property can easily be formed. In addition to advantageous characteristics proper to said polyimide resin, quality film incorporating distinct dimensional precision and thickness precision can be produced. Accordingly, the produced film can be available for flexible printed circuit boards, insulation films, seat belts, medical instruments, optical instruments, and specific field requiring extreme precision such as precision electronic parts.

The novel laminate film related to the invention can be produced by performing thermocompression bonding of the thermoplastic polyimide film formed by executing the above-described method against a conventional polyimide film such as "APICAL" (a product and a registered trade name of Kanegafuchi Chemical Industrial Co., Ltd.). For example, by winding the produced laminate film on a superconductor wire followed by performing thermocompression bonding at a temperature close to glass transition point, the superconductor wire can be covered with heat insulation covering material without deteriorating proper characteristics of superconductive wire.

Concretely, the inventive laminate film is structured by laminating a thermally resistant polyimide film and a thermal fusible adhesive agent layer composed of thermoplastic polyimide resin mainly comprising novel thermal fusible adhesive copolymer having 100° C. to 250° C. of glass transition point and being expressed by the aboveidentified General formula (1). The above-referred thermal fusible adhesive agent layer is formed by way of providing 1 $\mu$m through 50 $\mu$m of thickness, preferably 5 $\mu$m through 20 $\mu$m of thickness. This is because, if the thermal fusible adhesive agent layer were provided with a thickness thicker than the above range, it will cause processing problem to arise as the thermal fusible adhesive agent layer may protrude from edges of the polyimide film in the course of thermal adhesion, and yet, it will prevent the polyimide film from fully exerting own distinguished characteristics as another problem. Conversely, if the thermal fusible adhesive agent layer were thinner than the above-defined thickness range, it will fail to gain sufficient adhesive force.

It should be noted that the novel polyimide film incorporating thermal resistant property conceptually includes such film composed of those quasi-imide materials such as polyamide imide and polyether imide, and thus, any of these quasi-imide materials can also be used. As thermally resistant polyimide film, not only non-thermoplastic or thermosetting polyimide film, but such a film comprising thermally fusible adhesive copolymer having glass transition point much higher than that of the thermoplastic polyimide resin mainly comprising the copolymer incorporating thermally fusible adhesive property related to the invention can also be used.

Although such a polyimide film having 5 $\mu$m through 150 $\mu$m of thickness can be used, practically, it is desired that the film be provided with 10 $\mu$m through 125 $\mu$m of thickness. In particular, when using the film for covering wires, it is preferred that the film be provided with 10 $\mu$m through 75 $\mu$m of thickness. This is because, if the polyimide film were thinner than the above-defined thickness range, it will not only result in the difficulty to fabricate the desired laminate, but it will also cause the laminated film to be broken very easily during use. Conversely, if the polyimide film were provided with thicker thickness than the above-defined range, it will result in the difficulty to properly wind the film onto wires.

It is also possible to produce desired laminate films by executing an imidizing process by way of causing polyamide-acid copolymer solution being a precursor of the copolymer having the above-specified structure to directly flow on insulation material composed of another polyimide film instead of a support body or causing solution of the polyimide polymer having the above-specified structure to effect coating on another polyimide film followed by a drying process instead of effecting thermocompression bonding of a film comprising polyimide resin. In addition, predetermined laminate film may also be formed on another polyimide film via compression by applying polyimide resin in the form of powder particles.

The produced laminate film related to the invention is then wound into a roll as it is, or the laminate film is wound into a roll provided with another film comprising polyethylene terephthalate, polypropylene, or polyethylene serving as spacer being disposed on the part of thermal fusible adhesive agent layer of the laminate film. The latter composite film is ideally used for covering wires, for example.

In the case of using the above composite laminate film for covering wires, the composite laminate film is formed into a predetermined width. Owing to specific composition of the novel polyimide resin, the novel polyimide resin having specific constitution which is used for a thermal fusible adhesive agent layer in the invention incorporates a definite glass transition point between 100° C. and 250° C. to exhibit thermal fusible adhesive property when being laminated at a temperature close to said glass transition point. Accordingly, after winding the laminate film onto wires for example by disposing the thermal fusible adhesive agent layer in the inner side, by effect of heating the laminate film up to a certain temperature close to the glass transition point between 100° C. and 250° C., the thermal fusible adhesive agent layer of the laminate film is fused to be bonded with wires. Accordingly, wires are less affected by the heating, and thus no deterioration is incurred. Furthermore, the novel polyimide resin exhibits a negligible hygroscopic degree to minimize deterioration of proper characteristics caused by water absorbed therein. Moreover, since dielectric constant is as low as below 3, dielectric loss is minimized while feeding current to wires. In other words, wires can be prevented from being heated. It is also confirmed that the novel polyimide resin exhibits distinguished characteristic in the resistivity to radioactive rays.

Concretely, the novel laminate film according to the invention is distinctly satisfactory in processability under low temperature, flexibility, and adhesive property, and yet, minimizes deterioration of own properties caused by absorption of water and dielectric loss in the course of feeding current to wires covered with said laminate film, and moreover, proved to be distinctly resistant to radioactive rays. The novel laminate film according to the invention is particularly suited for covering superconductive wires, in particular, the novel laminate film is optimally suited for composing superconductor magnets built in each accelerator. There is no limit in the potential uses of the novel laminate film described above.

Figure 2:
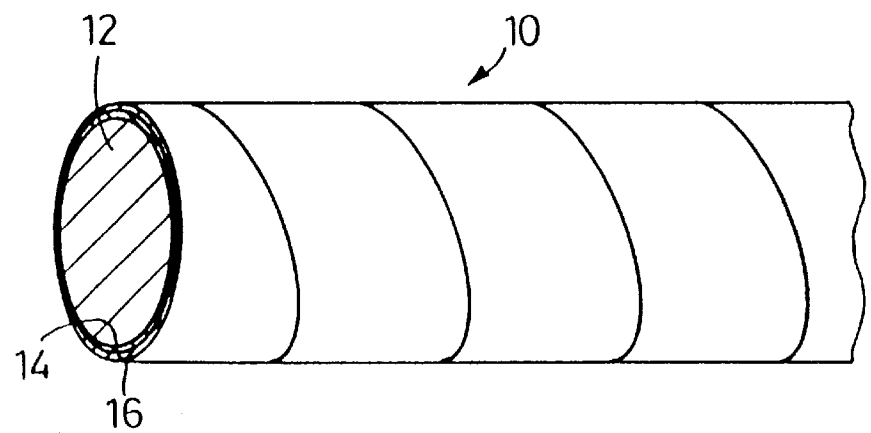
Figure 3:
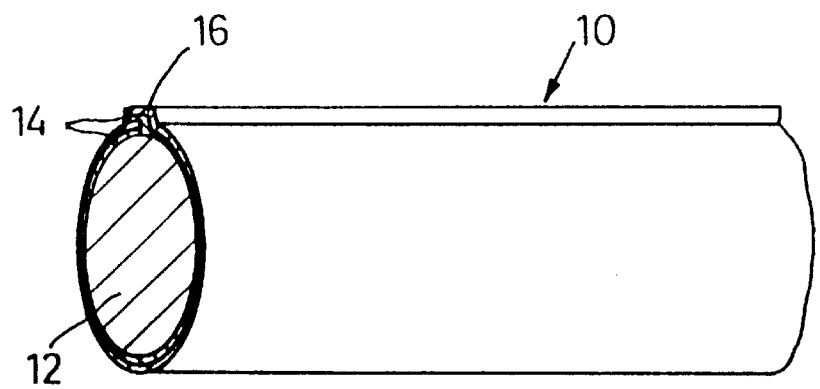

Normally, process for covering wires with the above-referred laminate film is executed in the following sequence. As shown in FIG. 1 for example, initially, a laminate film 10 having a predetermined width is spirally wound by way of superposing both ends of the laminate film 10 on external circumferential surface of each wire unit 12. Next, by heating the laminate film 10 wound on each wire unit 12 up to a predetermined temperature, a thermal fusible adhesive layer 14 is dissolved to cause a polyimide film 16 to be adhered to the wire unit 12 via thermal effect. A shown in FIG. 2, it is also practicable to effect winding of the laminate film 10 by abutting both ends thereof without superposing them. In addition, as shown in FIG. 3, the laminate film 10 may be wound alongside of the wire unit 12 by applying a laminate film 10 having a width slightly being wider than external circumference of the wire unit 12.

Instead of the above wounding methods, a method shown in FIG. 4 (*a*) may also be introduced. Initially, by slightly superposing both ends, the laminate film 10 is wound on external circumferential surface of each wire unit 12 by disposing a thermal fusible adhesive layer 14 on the outer side, and then, by slightly superposing another film 18 devoid of adhesive property on the outside of said layer 14 or by way of slightly interspacing between them. Next, the wound object is heated and applied with pressure to dissolve the thermal fusible adhesive layer 14 to cause the slightly superposed polyimide films 16 of the laminate film 10 to be adhered via thermal fusible effect to simultaneously cause the film 18 wound on the outside to be adhered thereto via thermal fusible effect. According to the method described above, as shown in FIG. 4(*b*), the laminate film 10 is tubularly formed so that it can cover external circumferential surface of the wire unit 12 in the state without being adhered to the wire unit 12. Formation of this structure has proved that physical characteristics of wires have been improved, and thus, introduction of the above method is preferred. The above-referred film 18 may be of the one identical to or different from the polyimide film 16 making up the laminate film 10 of the invention.

In addition, there is another method of covering wires with insulation covering material to implement the invention, which initially superposes the novel polyimide film comprising polyimide resin incorporating the above specific constitution usable for composing thermal fusible adhesive agent layer related to the invention and a conventional polyimide film such as "APICAL" in double, and then winds both onto a wire unit before effecting thermocompression bonding of them. Since the invention uses such a laminate film consisting of the laminate of the novel polyimide film and another polyimide film previously being laminated with a thermal fusible adhesive agent layer, handling and working conveniences as well as productivity can be promoted, and thus, introduction of the novel laminate film materialized by the invention is preferred.

In addition, the novel polyimide film incorporating the above specific constitution which is used for composing a thermal fusible adhesive agent layer is also available for insulation covering material in itself. Concretely, a double composition comprising the novel polyimide film superposed with peelable paper is wound on a wire unit, and then, after completing a thermocompression bonding process, the peelable paper is stripped off from the polyimide film.

Furthermore, the novel laminate film comprising the novel polyimide resin incorporating thermal fusible adhesive property being used for composing a thermal fusible adhesive agent layer is optimally suited to serve as a thermal fusible adhesive agent for insulative covering of superconductor magnets built in an accelerator. In addition, the novel polyimide film is also useful for composing insulation covering material for superconductive magnets built in a nuclear-fusion furnace, a radioluminescent installation, a medical-cure installation via irradiation of radioactive rays, an NMR, and a linear motor, and yet, the novel polyimide film is also useful for composing insulation covering material for superconductor magnets and wires. There is no restriction on the use of the novel laminate film in particular.

When being used for covering wires, the novel laminate film made from thermal fusible adhesive agent layers composed of thermoplastic resin mainly comprising the above-described thermal fusible adhesive copolymer exerts proper characteristics of said thermoplastic resin, and yet, the laminate film can be adhered to wires via thermal fusible effect within a temperature range without causing physical characteristics of wires to be deteriorated. Accordingly, wires can be covered with the novel polyimide film without affecting proper characteristics, i.e., superconductivity or the like of the covered wires.

Furthermore, by nipping the novel polyimide film comprising novel polyimide copolymer incorporating the above-described thermal fusible adhesive property between a conventional polyimide film such as the above-referred "APICAL" (a product and a registered trade name of Kanegafuchi Chemical Industrial Co., Ltd.) and a copper foil, and adhering them, thereafter by performing thermocompression bonding, the novel laminate film made from the above-described thermoplastic polyimide film mainly comprising novel copolymer having thermal fusible adhesive property can easily be produced as the one optimally suited for composing, for example, a flexible copper-coated laminated board combined with a resin layer and a metal layer.

The above-described laminate film can also be produced by executing the following processes; initially, polyamide acid solution being a precursor of the novel polyimide copolymer incorporating thermally fusible adhesive property according to the invention is fluidly led onto non-thermoplastic polyimide film or imidized via coating, and then, an adhesive surface of the imidized film is thermocompression-bonded with a copper foil to complete production of the laminate film. Conversely, it is also practicable to produce imidized polyimide film by executing the following processes; initially, polyamide acid solution is fluidly led onto a copper foil or applied thereon via coating and then imidized, followed by a process of thermocompression bonding of an adhesive surface and a thermoplastic polyimide film, or a process to fluidly feed thermosetting polyamide acid solution to said adhesive surface or apply said solution thereto via coating, and finally, coated solution is imidized to form a polyimide film. In place of the above-referred non-thermoplastic polyimide film, it is possible to use a thermal fusible adhesive polyimide film incorporating a glass transition point considerably higher than that of the novel copolymer incorporating thermal fusible adhesive property according to the invention.

The novel laminate film produced by executing the above-referred processes is characterized by unique composition consisting of a base-film layer comprising thermally resistant resin, an intermediate layer consisting of thermoplastic polyimide resin mainly comprising the above-described novel copolymer incorporating thermal fusible adhesive property, and an electric conductor. The novel laminate film exhibits extremely higher heat resistant property than that of any conventional adhesive agent and exhibits distinctly better adhesive property than that of any conventional polyimide adhesive agents by virtue of achieving thermocompression bonding under a relatively low temperature and in a relatively short period of time, and yet the novel laminate film can be produced very easily. The novel laminate film can effectively be used for composing flexible copper-coated laminate boards, for example.

In the case of using the novel laminate film for composing a flexible copper-coated laminate board, the base-film layer and the intermediate layer are respectively composed of polyimide. In the case of manufacturing a flexible printed circuit board, following a copper-foil etching process, perforation can be executed via an alkali etching process, and thus, the flexible printed circuit board can easily be manufactured.

Furthermore, by virtue of distinctly low hygroscopic characteristic and dielectric constant, the novel laminate film can ideally be used for composing electronic circuit parts or the like that can satisfy demand for high-density loading of parts in the future. In addition, the novel laminate film also incorporates high viscosity so that sufficient mechanical strength can be exerted. Furthermore, by blending thermoplastic resins such as nylon, polyvinyl acetate, polytetrafluoroethylene and polymethacrylic acid methyl, filler and glass fiber, with the novel copolymer incorporating thermal fusible adhesive property according to the invention, such a resin composite incorporating enhanced physical characteristics such as mechanical strength and adhesive property can be produced, and consequently, the novel laminate film related to the invention can be produced from said resin composite in order that the novel laminate film can be used for manufacturing a flexible copper-coated laminate board.

It is possible to compose laminated insulation material by utilizing reflection films made from thermoplastic resin mainly consisting of the above-described thermal fusible adhesive copolymer related to the invention. The laminated insulation material is composed of said reflection films and netted spacers comprising plastic yarns which are alternately laminated, wherein each of the reflection films is structured by forming metal (such as aluminium) layers on a single surface or on both surfaces or inside of a plastic film consisting of thermoplastic polyimide resin mainly comprising novel copolymer incorporating thermal fusible adhesive property and 100° C. to 250° C. of glass transition point, especially the one represented by the above identified General formula (1).

Referring now to the accompanying drawings, practical form of the novel laminated insulation material related to the invention is concretely described below. As shown in FIG. 5, the novel laminated insulation material 20 is structured by alternately laminating a plurality of reflection films 22 and a plurality of spacers 24, where adjoining reflection films 22 can be prevented from directly being brought into contact with each other by the spacers 24 interposed therebetween.

As shown in FIG. 6, each of the reflection films 22 is composed of a plastic film 26 having both surfaces adhered with metal foils or metal films 28 made from aluminium or the like. The metal foil 28 or the metal film 28 may be formed on a single surface of the plastic film 26. The reflection film 22 is a laminate of the metal layer 28 and the plastic film 26. The metal foil 28 or the metal film 28 composed of aluminium for example functions as a reflective body to shield heat from external source. The plastic film 26 makes the reflection film 22 into non-thermal conductive material to prevent temperature from being raised by thermal conduction. By effect of adhering the metal foil 28 or the metal film 28 to the plastic film 26, the metal foil 28 or the metal film 28 shields heat from external source to provide the reflection film 22 with insulating characteristic being free from thermal conduction, thus preventing temperature from being raised by thermal conduction.

Not only aluminium, but metal such as lead may also be used for composing the metal foil 28 or the metal film 28 from the viewpoint of resistivity against radioactive rays. For example, reflection films composed of aluminium foil and reflection films composed of lead foil may alternately be laminated, or such reflection films composed of lead foils may partially be included in the laminate structure. The reflection film may also comprise an aluminium foil on one surface of the reflection film and a lead foil on the other surface thereof.

If such a plastic film 26 devoid of resistivity against radioactive rays were used, it will cause the film to be deteriorated by irradiation of radioactive rays to result in the generation of thermal conductivity in the reflection film, thus lowering thermal insulation effect. To prevent this, the inventive art uses thermoplastic polyimide resin film mainly comprising novel copolymer incorporating thermal fusible adhesive property related to the invention. Since the inventive thermoplastic polyimide resin incorporates distinct resistivity against radioactive rays, the laminated insulation material 20 can be prevented from lowering own thermal insulation characteristic otherwise caused by deterioration of the film generated by irradiation of radioactive rays. In other words, the laminated insulation material 20 related to the invention is provided with resistivity against radioactive rays, and accordingly, the invention can provide unique laminated insulation material 20 that can stably be used even in the field of nuclear fusion and accelerators.

Furthermore, as was described earlier, since the novel film 26 comprising the above-referred thermoplastic polyimide resin exhibits an extremely lower dielectric constant than that of any conventional thermosetting polyimide resins, the novel film 26 can minimize dielectric loss, and thus, it can effectively suppress generation of heat in such locations being exposed to intense magnetism generated from superconductor magnets built in accelerators or nuclear fusion furnaces, thus ideally being suited for use in this specific field. In addition, the novel laminated insulation material 20 is free from lowering own thermal insulation effect otherwise caused by deterioration of the film upon exposure to irradiated radioactive rays. In other words, the invention can provide the laminated insulation material 20 according to the invention with resistivity against radioactive rays, and accordingly, the inventive laminated insulation material 20 can be utilized for thermal insulation in the field of nuclear fusion or accelerators.

After yielding polyamide copolymer solution via a conventionally known process, the solution is fluidly led onto a support body or spread thereon via coating to form a film, and then, after a drying process, a self-supporting film is generated, and then the film is further heated to be imidized before the inventive thermoplastic polyimide film 26 is eventually produced. Alternatively, it is also practicable to add dehydrant by such an amount in excess of stoichiometric value and tertiary amine corresponding to catalytic amount to the polyamide copolymer solution, and then, in the same way as was done for the above step, the blend solution is imidized to eventually produce the thermoplastic polyimide resin film 26. Because of own composition, the thermoplastic polyimide resin film 26 produced via the above-described processes has a definite glass transition point between 100° C. and 250° C., thereby making it possible to effect adhesion of a metal foil thereto via a laminating process executed at a temperature close to or in excess of the glass transition point. It is also confirmed that the novel thermoplastic polyimide film 26 exhibits distinct resistivity against radioactive rays as well.

Concretely, the above-referred reflection film 22 can be produced from the above thermoplastic polyimide resin incorporating thermal fusible adhesive property by initially disposing aluminium foils 28 on both surfaces of the thermoplastic polyimide film 26, and then the superposed film and foils are thermocompression-bonded at a temperature close to or above the glass transition point, for example in excess of 150° C. to effect adhesion of the aluminium foils 28 to easily implement production of the reflection film 22. It is suggested that the thermoplastic polyimide resin film 26 be provided with 6 μm through 25 μm of thickness of an optimal range. It is also practicable to perform thermocompression bonding of aluminium foil 28 on one surface of the polyimide film 26 to form a reflection film having a metal layer on one surface thereof. In addition, it is also practicable to produce the reflection film 22 having a metal film 28 by depositing aluminium on one surface or on both surfaces of the thermoplastic polyimide film 26 via evaporation.

The reflection film 30 shown in FIG. 7 incorporates a metal layer 28 which is fully covered with plastic resin to prevent thermal conduction from being generated otherwise caused by exposed portion of the metal layer 28, and thus, the reflection film 30 is optimally suited for composing thermal insulation material. The reflection film 30 can be produced by executing the following processes; initially, dissolved substance or solution of the above-referred thermoplastic polyimide resin is spread on both surfaces of the aluminium foil 28 via coating, and then a curing process and other processes are executed to form a polyimide film 26 having 6 μm though 25 μm of thickness to form a reflection film 30 having a metal layer 28 inside of the polyimide film 26. It is also practicable to initially coat one surface of the aluminium foil 28 with dissolved substance or solution of the above-referred thermoplastic polyimide resin so that a reflection film 30 having a metal layer 28 on one surface of the polyimide film 26 can be produced. As another method, it is also practicable to initially coat one surface or both surfaces of the aluminium foil 28 with solution of polyamide acid copolymer being a precursor of the above-referred thermoplastic polyimide resin, followed by execution of a drying process before imidizing the dried substance to complete formation of the reflection film 30.

As another practical method of forming a reflection film 36, as shown in FIG. 8, in the case of using a film 32 comprising curable polyimide resin incorporating thermal resistant property and resistivity against radioactive rays, aluminium foil 28 is disposed on one surface or on both surfaces of the curable polyimide film 32 via a thermoplastic polyimide resin film 34, and then the aluminium foil 28 is adhered to said surface via adhesive effect of the thermoplastic polyimide resin to complete formation of the reflection film 36.

The above-referred spacers 24 are alternately laminated in order that adjoining reflection films 22 can be prevented from coming into contact with each other via the spacers 24. The spacers 24 are respectively disposed to maintain non-thermal conductive property of thermal insulation material 20 and usefully utilize respective reflection films. Accordingly, the invention can provide such a useful thermal insulation material 20 distinguished in thermal insulating characteristic. If the above-referred spacers 24 were absent, then thermal conduction cannot be prevented from occurrence to lower the effect of laminating the reflection films 22, 30 and 36, to eventually result in the poor effect of thermal insulation. Accordingly, in order to enhance thermal insulation effect of the above-referred laminated thermal insulation material 20, it is essential that the reflection films 22, 30, and 36 be respectively laminated via the interposed spacers 24.

It is desired that the spacers 24 be composed of netted plastic yarns having a maximum of 50 deniers each. In order to form netted structure, either textile fabrics or knits, or punched sheets may be used. It is essential that fold or stitch be held stationary without being biased while being used as the spacer 24, and yet, each spacer 24 needs to fully absorb oscillation via presence of space between folds and stitches, and yet, must be of such a shape capable of generating thermal insulation effect. For example, it is preferred that a leno woven fabric or such a knit having net shape formed via waltex knitting be used for the spacers 24. The terms "leno weaving" is a method of weaving warps in combination with wefts in which warps also interwinded with other warps to generate interspace between them. This is an suitable method for weaving such a fabric available for net-shaped spacers 24.

It is desired that the net-shaped spacers 24 used for composing the laminated thermal insulation material 20 be provided from a net-shaped woven fabric or a knit comprising plastic yarns each having a maximum of 50 deniers. Thickness of available plastic yarns can optionally be determined and selected in correspondence with objects according to requirements in consideration of the number of laminated layers, minimum weight, thickness of each layer or oscillation-resistant property, depending on the condition of which the inventive laminated thermal insulation material is used. For example, in the case of increasing the number of laminated layers to deal with narrow space available for setting or in the case of reducing weight, it is allowable to use plastic yarns each having a maximum of 25 deniers to increase the number of laminated layers of insulation material or produce light-weight insulation material. In the case of considering thickness of laminated layers and oscillation-resistant property, it is allowable to make use of plastic yarns each having 25 through 50 deniers of thickness so that layer thickness can be expanded to promote oscillation-resistant property. Furthermore, it is possible to provide enough thickness and lighter weight for the insulation material by interweaving two kinds or more than two kinds of yarns having different thickness. For example, two kinds of yarns having 20 and 30 deniers can be interwoven.

It is desired that the net-shaped spacer 24 used for the invention be provided with 710 μm through 1000 μm (16 through 24 according to Tyler method) of mesh number in accordance with JIS specification. In particular, it is optimal that mesh number be slightly less than or more than 840 μm (20 according to Tyler method). If the mesh number exceeds 1000 μm (less than 16 according to Tyler method), it is feared that the adjoining reflection films 22 may directly come into contact with each other via spacers 24. Conversely, if the mesh number were less than 710 μm (if the mesh number exceeds 24 according to specification of Tyler method), then, interface area between each reflection film 22 and each spacer 24 will be increased to such a scope beyond what is actually needed.

To compose spacers 24, polyester yarns or polyamide yarns are available. However, polyimide yarns are better suited for spacers. In the case of using thermoplastic polyimide yarns, because of own thermoplasticity, it is possible to produce such a laminated thermal insulation material solely comprising thermoplastic polyimide and metal foils featuring distinguished thermal resistant property and resistivity against radioactive rays. Although there is no restriction on the constitution of thermoplastic polyimide, it is preferred that the above thermoplastic polyimide resin usable for the above reflection film be introduced. Either an individual kind or combined kinds of yarns can be used.

There is no restriction on the number of laminated layers of the above-referred reflection film 22 and spacer 24, but the number of laminated layers may optionally be determined in consideration of predetermined space needed for installation and the desired rate of thermal insulation. It is suggested however that, in normal cases, provision of 10 through 60 layers is optimal.

Figure 9:
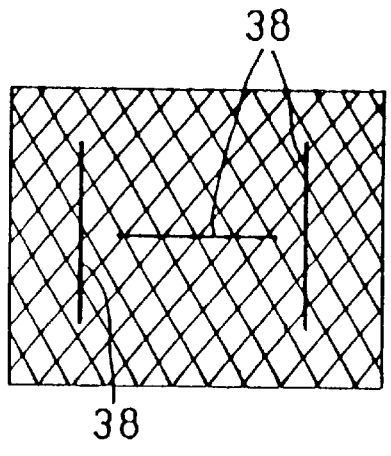
FIG. 9 and 10 are respectively plans exemplifying the state of effecting sewing of the laminated insulating material related to the invention.
Figure 10:
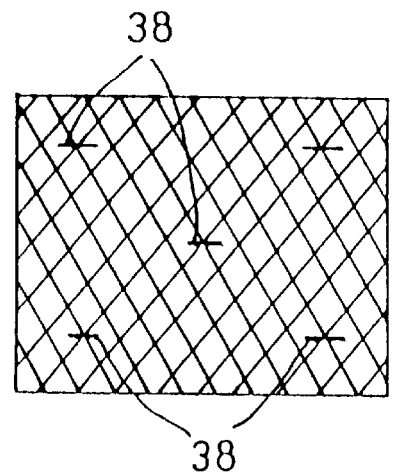
Figure 11:
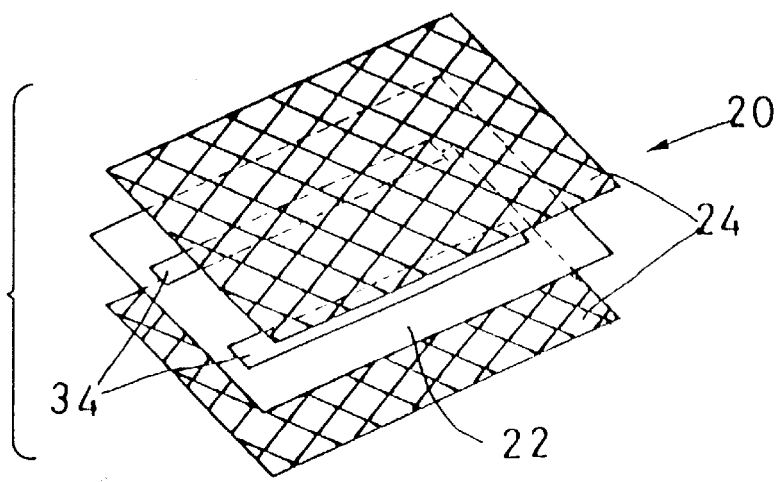
FIG. 11 is a plan exemplifying the state of effecting adhesion of the laminated insulating materials related to the invention.

As shown in FIG. 5, a method of laminating the reflection films 22 and the spacers 24 is exemplified by way of sewing up both the reflection films 22 and the spacers 24 along lines 38. However, in place of sewing them, both may be bonded to each other by effect of thermoplastic polyimide resin. By implementing either sewing or adhesion for laminating the both components, the reflection films 22 can be prevented from respectively being displaced, and yet, proper characteristics of the laminate such as thermal insulating property, resistivity against radioactive rays, and oscillation resistant property can be fully exerted by reinforcing own strength of the laminate itself. To implement sewing, it is desired that thin plastic yarns be used. Not only the sewing lines 38 shown in FIG. 5, but as shown in FIG. 9 and FIG. 10, partial sewing may also be implemented. To effect adhesion, in place of thermocompression bonding, the above-described thermoplastic polyimide resin may be used to function as an adhesive agent. Furthermore, as shown in FIG. 11, thermocompression bonding may also be executed by nipping a plurality of rectangularly cut pieces of thermoplastic polyimide film 34 between each reflection film 22 and each spacer 24.

The inventive laminated thermal insulation material is produced by executing the above processes, which is complete with laminated layers of plastic films composed of thermoplastic polyimide resin mainly comprising the inventive thermally fusible adhesive copolymer and netformed spacers comprising plastic yarns, wherein the laminated thermal insulation material incorporates distinctly effective resistivity against radioactive rays and minimum dielectric constant by virtue of physical characteristics of the thermoplastic polyimide resin, and accordingly, the novel laminated thermal insulation material can effectively be used for composing thermal insulation materials inside of accelerators, nuclear-fusion furnaces, or space-crafts, etc.

Figure 12:
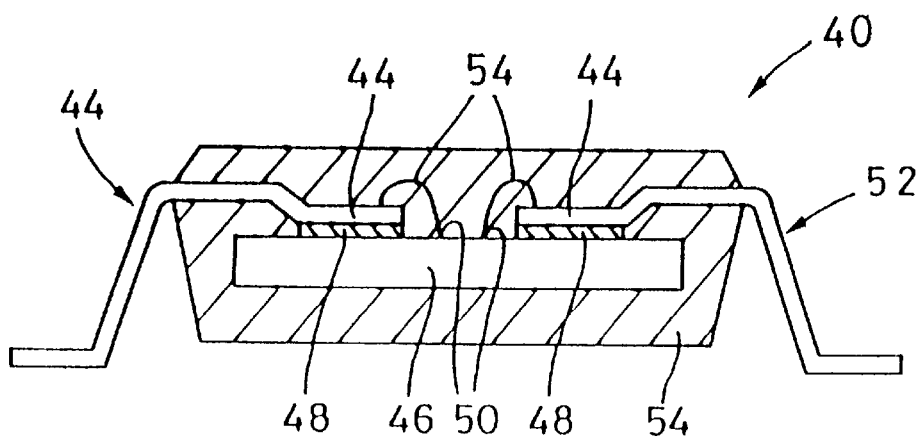
FIG. 12 is a cross-sectional view of an exemplified semiconductor module which makes up an example of the novel electronic module related to the invention.

Novel semiconductor module offered by the invention comprises a structure in which at least a lead frame and a semiconductor chip are directly or indirectly bonded via an adhesive agent layer, and yet, except for a part of the lead frame, the whole is sealed by resin to form a package. The adhesive agent layer is characteristically composed of thermoplastic polyimide resin incorporating a specific constitution. More concretely, for example, a semiconductor module 40 shown in FIG. 12 uses a lead frame 42 devoid of die pad, where an inner lead 44 is secured to a semiconductor chip 46 via an adhesive agent layer 48 composed of specific thermoplastic polyimide resin, and then, after connecting an electrode terminal 50 of the semiconductor chip 46 with the inner lead 44 via a bonding wire 52, except for a part of the lead frame 42, the whole periphery is sealed with resin 54 to form a packaged structure.

In order to secure the inner lead 44 to the semiconductor chip 46 in the course of forming the novel semiconductor module 40, a specific thermoplastic polyimide resin is formed into a film, which is then interposed between the inner lead 44 and the semiconductor chip 46 and then thermocompression bonding is performed to a temperature close to own glass transition point. By effect of forming an adhesive agent layer 48, the inner lead 44 is secured to the semiconductor chip 46 and simultaneously both are insulated from each other.

Figure 13:
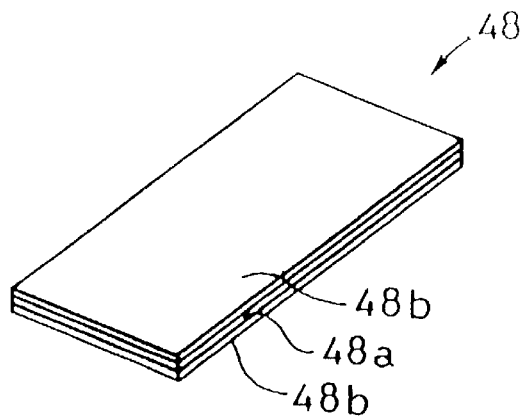
FIG. 13 is a perspective view exemplifying another example of a layer of adhesive agent used for composing the electronic module related to the invention.

Since thermoplastic polyimide resin exhibits heat insulation property and incorporates sufficient mechanical strength, it can be formed into a film usable for an adhesive agent. It is also practicable to initially produce a bilateral adhesive sheet 48 by forming a pair of layers 48b composed of the above-referred thermoplastic polyimide resin on both surfaces of a non-thermoplastic polyimide film 48a making up a base film such as "APICAL" (a product and a registered trade name of Kanegafuchi Chemical Industrial Co., Ltd.) for example, and then use the bilateral adhesive sheet 48 by way of serving as the above-referred adhesive agent layer as shown in FIG. 13. This example is preferred in such a case requiring insulation characteristic in particular.

Figure 14:
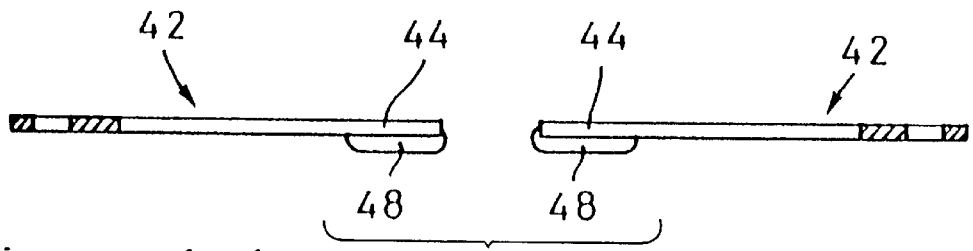
FIG. 14 is a cross-sectional view exemplifying another method of forming a layer of adhesive agent used for composing the electronic module related to the invention.

In addition, such a method shown in FIG. 14 is also practicable for the invention, which initially coats tip of the inner lead 44 with solution of polyamide acid being a precursor of the above thermoplastic polyimide resin, and then the coated solution is dried. Next, the dried object is further heated to be imidized, and then, an adhesive agent layer 48 is formed. After disposing the semiconductor chip 46, thermocompression bonding is effected to the semiconductor chip 46. Alternatively, it is also practicable to initially coat tip of the inner lead 44 with solution of polyamide acid, and then, after a drying process, the semiconductor chip 46 is bonded simultaneous with execution of the imidizing process. There is no restriction on the method of effecting adhesion.

Figure 15:
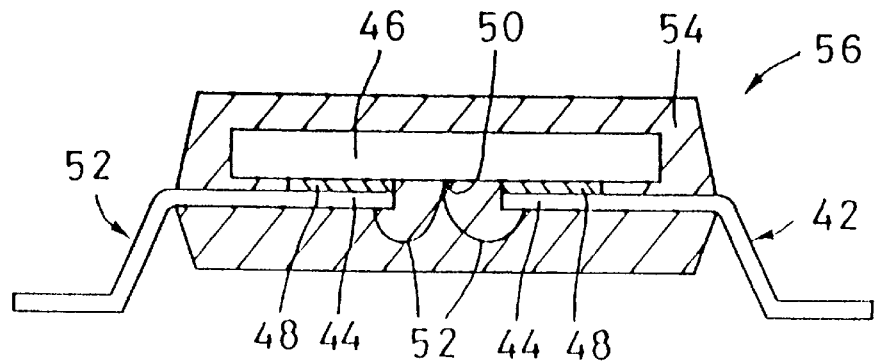
FIG. 15 through 18 are respectively cross-sectional views exemplifying further structures of semiconductor modules respectively making up further examples of the electronic modules related to the invention.

The above description has referred to a practical example of a semiconductor module to exemplify an electronic module related to the invention. However, the scope of the invention is not merely limited to the above-referred examples. For example, as shown in FIG. 15, scope of the invention may also include a COL-structured semiconductor module 56 comprising a semiconductor chip 46 secured on a lead frame 42 via an adhesive agent layer 48.

Figure 16:
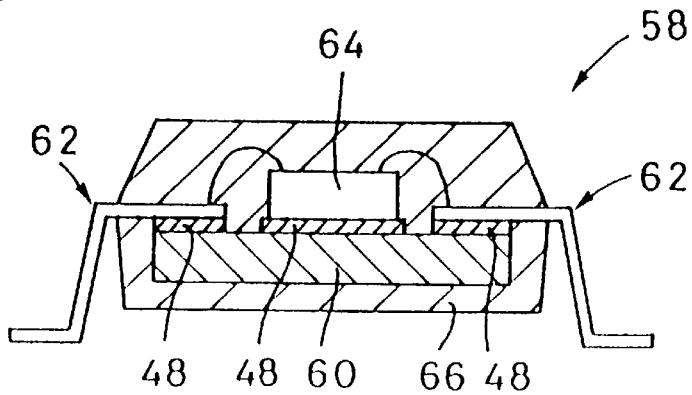
Figure 17:
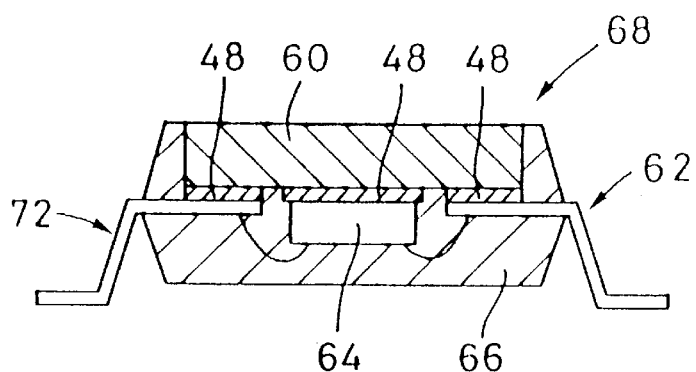

In addition, scope of the invention may also include such a structuring method comprising the following; in the case of forming a semiconductor module 58 shown in FIG. 16, a semiconductor chip 64 is adhered onto an upper surface of a thermal-radiative lead frame integrating a radiative sheet 60 with a lead frame 62 via an adhesive agent layer 48 by effect of the adhesive agent layer 48, and then, the integrated unit is sealed with a molding resin 66 to form a package; and in the case of forming a semiconductor module 68 shown in FIG. 17, the surface on the side opposite to the lead frame side of the radiative sheet 60 is exposed from the molded resin 66.

Figure 18:
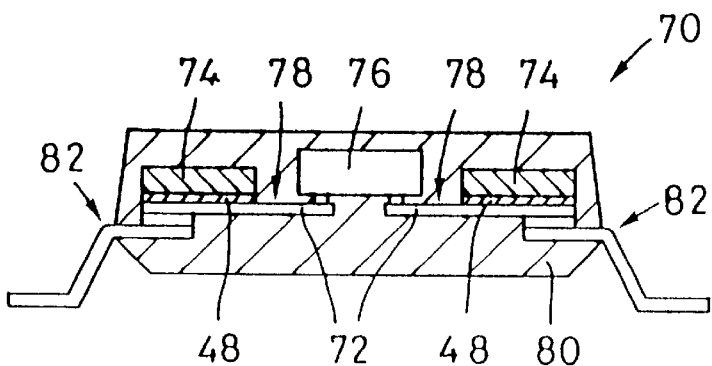

Furthermore, as in the case of a semiconductor module 70 shown in FIG. 18, using a triple-layer TAB tape comprising a copper foil 72 and a polyimide film 74 jointly being adhered by adhesive agent 48, a semiconductor chip 76 is adhered to an inner lead 78 of the TAB tape without using wires, and then the bonded unit is sealed by resin 80 to form a package.

Although not being illustrated in the drawings, the adhesive agent cited in the invention is preferred for use in such a semiconductor module having a structure being packaged by sealing resin and containing an adhesive layer in the package, and yet, the above-cited adhesive agent may be applied to semiconductor modules incorporating any kind of structure. It should be understood however that the scope of the invention is not merely limited to the above-described semiconductor modules, but the invention is also applicable to those electronic modules using other electronic elements, and that the invention may be embodied by way of adding a variety of improvements, changes, and modifications, based on knowledges of those skilled in the art within a scope without deviating from basic essentials of the invention.

Owing to the constitution of the novel copolymer, the inventive thermoplastic polyimide resin mainly comprising said copolymer incorporating a specific constitution used for composing adhesive agent layer of electronic module has a definite glass transition point between 100° C. and 250° C., and exhibits distinct adhesive property by effect of thermocompression bonding at a temperature close to the glass transition point, and yet, it proves to be distinguished in adhesive property under low temperature and in thermal resistant property as well. In addition, the novel thermoplastic polyimide resin exhibits as low as about 1% of hygroscopic degree after immersing it in pure water at 20° C. for 24 hours. In addition, the novel thermoplastic polyimide resin proves to be also distinct in a variety of characteristics such as resistivity against radioactive rays without incurring deterioration and discoloration at all from irradiated radioactive rays.

Accordingly, the novel thermoplastic polyimide resin featuring the above-described distinct characteristics is suited for composing an adhesive agent layer that needs to exert distinct adhesive property at a relatively low temperature within a short period of time, and thus, even such an extremely fine inner lead can solidly be adhered to a semiconductor chip in the course of manufacturing a semiconductor chip. Accordingly, the novel semiconductor module based on the invention promotes productivity without causing semiconductor chips to be affected by heat generated during adhesion process in the course of the production. And yet, since the adhesive agent layer contains an extremely low hygroscopic degree, any package accommodating the inventive semiconductor module can be prevented from incurring crack otherwise caused by infiltration of water therein, thus sharply promoting reliability of the produced package. In addition, since adhesive agent layers of the inventive semiconductor module exerts distinct thermal resistant property, even when executing a reflow soldering process or being subject to thermal stress such as temperature cycle, interface of the adhesive layer is free from being stripped off. The inventive semiconductor module can be utilized for such an apparatus potentially being subject to exposure to radioactive rays.

Furthermore, using the above-described thermoplastic polyimide film incorporating thermal fusible adhesive property mainly comprising the above-described thermal fusible adhesive copolymer as a dielectric layer, such a capacitor characterized by distinguished physical properties can be manufactured. There is no restriction on the method of manufacturing capacitors related to the invention in particular. For example, by alternately laminating the above-described thermoplastic polyimide film and metal foils such as copper foils or aluminium foils, the laminated components are thermocompression-bonded to each other at a temperature higher than the glass transition point of the thermoplastic polyimde resin to provide a novel capacitor. Alternatively, by alternately winding laminated sheets comprising alternately laminated thermoplastic polyimide films and metal foils such as copper or aluminium foils, the wound-up laminated sheets are thermocompression-bonded to each other to prepare a novel capacitor, which is then provided with an electrode unit or secured to a printed circuit board via soldering as it is to complete a capacitor related to the invention.

Figure 19:
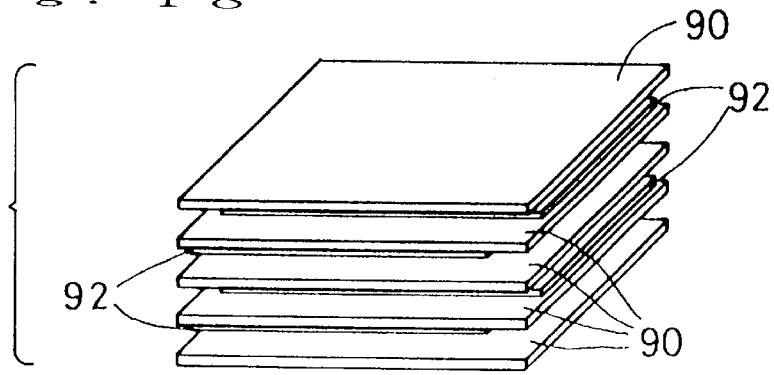
FIG. 19 (a) through (c) are respectively perspective views of exploded essential portions of capacitors for exemplifying processes for fabricating said capacitors related to the invention.
Figure 19:
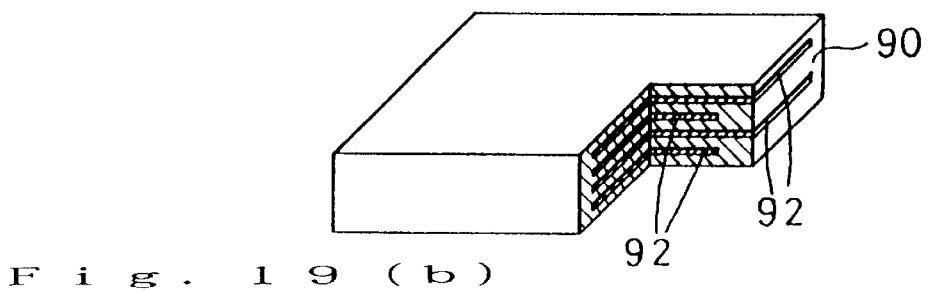
Figure 19:
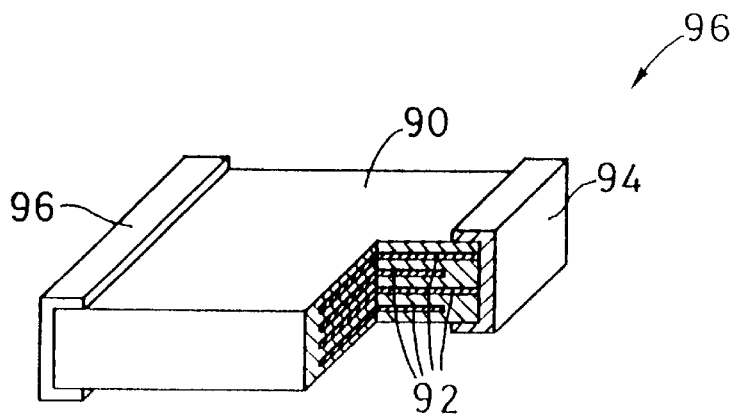

Concretely, as shown in FIG. 19(*a*), the above-referred thermoplastic polyimide resin films 90 each making up a dielectric layer and metal foils comprising copper or aluminium foils 92 each making up an inner electrode unit are alternately laminated, and then, the laminated components are thermocompression-bonded to each other at a temperature higher than that is close to the glass transition point of the thermoplastic polyimide film 90, i.e., at a temperature higher than 100° C. through 250° C. to integrate them altogether. Then, as shown in FIG. 19(*b*), the dielectric layers 90 and the inner electrode units 92 are alternately laminated in order that the inner electrode unit 92 can fully be exposed at both-edge surfaces every other layer unit, preferably it is so arranged that both edges are cut to cause edges of each inner electrode unit 92 to be externally exposed. Then, as shown in FIG. 19(*c*), each of the inner electrode units 92 exposed at both edges is connected to each corresponding external electrode 94 to complete production of a laminated capacitor 96. Note that the external electrodes 94 are not always needed, but instead, it is also practicable to directly set them on a printed circuit board via a soldering process so that the inner electrodes 92 can be connected thereto.

In the course of designing capacitor, electrostatic capacity can be determined in consideration of dielectric constant of resin used for composing dielectric layers, thickness of dielectric layers, and electrode area. When each dielectric layer must be of thicker thickness in order to produce such a capacitor containing desired electrostatic capacity, as shown in FIG. 19, instead of alternately laminating each polyimide film 90 and each metal foil 92, a plurality of said films 90 may be laminated to provide a predetermined thickness.

Instead of using the thermoplastic polyimide copolymer film, it is also practicable to initially form a film comprising layers having a predetermined thickness by solidifying powder particles of said thermoplastic polyimide copolymer via pressure and then integrate the film with a metal foil as was done for the above case. Alternatively, it is also practicable to initially stuff powder particles of the above-referred thermoplastic polyimide copolymer and a metal foil in a predetermined mold and then integrate the stuffed component via a heating process. Alternatively, it is also practicable to produce a film by applying an extrusion molding of proper substance dissolved from powder particles of the above-referred thermoplastic polyimide copolymer. This method is better suited for producing a thick film.

It is also practicable to blend thermoplastic resins such as nylon, polyvinyl acetate, polyvinyl chloride, polytetrafluoroethylene, or polymethacrylic-acid methyl, with the novel copolymer incorporating thermal fusible adhesive property and the above-described specific constitution usable for composing dielectric layers of the capacitors related to the invention to yield such a resin composition incorporating improved physical characteristics such as mechanical strength and adhesive property. Such a novel resin composition can effectively be used for composing dielectric layers of capacitors.

The above description has exemplified use of metal foils such as copper or aluminium foils for composing electrodes of the capacitor related to the invention. In addition, any kind of conductor such as black lead or solder and conductive foil and semiconductor are conceivable for practical use, and yet, any kind of electrode may also be used.

Figure 20:
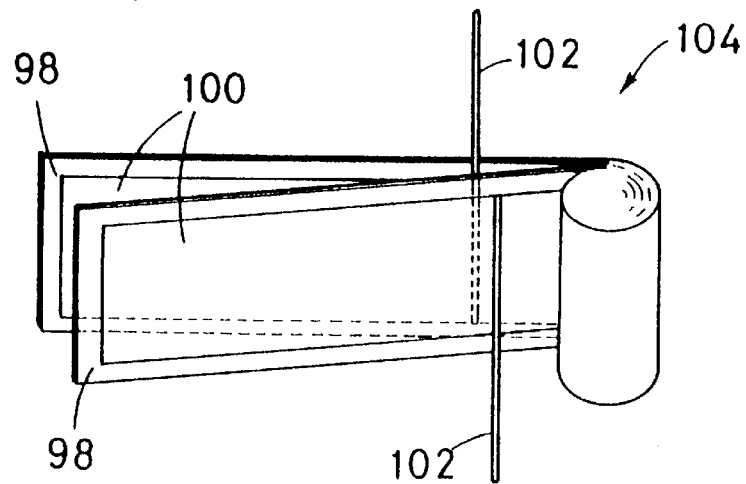
FIG. 20 is a perspective view for explanatory of another method of fabricating the capacitors related to the invention.

As another form of the capacitor related to the invention, as shown in FIG. 20, it is also practicable to form lead wires 102 in conjunction with a laminate of a thermoplastic polyimide film 98 having the above-referred specific constitution and a metal foil 100, and then, each laminate is alternately wound up to form an integrally coiled type capacitor 104 via a thermal sealing process. Likewise, it is also possible to form a parallel-plate capacitor or a cylindrical capacitor. Form and method of manufacturing capacitors are not restricted in particular.

Not only the methods for manufacturing capacitors thus far described, as was conventionally done for applying conventional polyimide resin film to dielectric layers, it is also practicable to produce a novel capacitor related to the invention by initially coating surface of a metal foil such as a copper foil with solution of polyamide acid copolymer being a precursor of the novel thermoplastic polyimide resin film followed by execution of an imidization process. Furthermore, it is also practicable to produce a novel capacitor related to the invention by initially imidizing said polyamide acid copolymer in any unrestricted condition of form such as in film form, lump form, or powder particle form, followed by a process to dissolve the imidized substance in organic solvent to generate solution of thermoplastic polyimide, and then, the metal foil is coated with said solution, and finally, the capacitor is completed after fully drying the coated solvent.

In the case of executing the above processes, kind and solubility of organic solvent are variable according to the kind of $Ar_1$ radical, $Ar_2$ radical, R-radical and X-radical, and the ratio of 1, m and n included in the General formula (1) shown below.

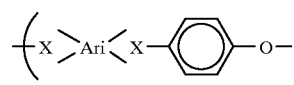
(1)

-continued

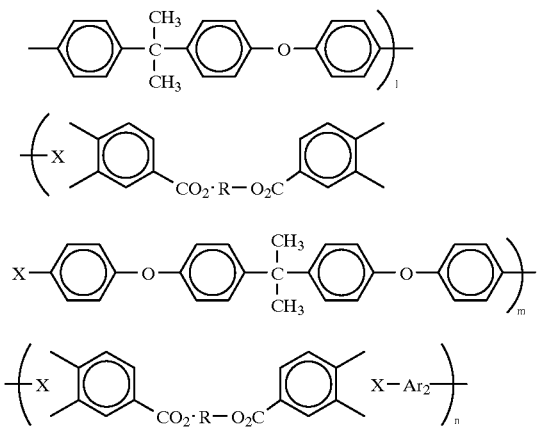

It is also practicable to form electrodes via a sputtering process applied onto surface of the thermoplastic polyimide resin by utilizing any existing facilities.

Since the inventive capacitor incorporating dielectric layers consisting of thermoplastic polyimide films mainly comprising the above-described novel copolymer incorporating thermal fusible adhesive property contains such a hygroscopic degree significantly being lower than that of conventional capacitors, potential use of capacitor is expanded, and yet, since the above resin itself contains adhesive property, capacitors can easily be manufactured. In addition, the invention permits capacitors to be used in such fields where severe service condition such as thermal resistant property, chemical resistant property, resistivity against radioactive rays, are critically demanded.

The above description has explained practical forms of embodying the invention in order to clarify practical utility of powder particles, film, laminated thermal insulation material, electronic modules, and capacitors, made from inventive thermoplastic polyimide resin mainly comprising novel copolymer incorporating thermal fusible adhesive property. It should be understood however that the scope of the invention is by no means limited to the above-described forms, but the invention can also be embodied by way of adding a variety of improvement, changes, and modifications based on knowledges of those skilled in the art within a scope without deviating from basic essentials of the invention. The invention is more concretely described herein below by referring to the following Examples. However, the scope of the invention is not merely limited to the practical examples described below.

To begin with, for reference to the following Examples, practical methods for preparing bis(2-(4-aminophenoxy) ethyl)ether used for implementing the inventive Examples are described below.

Synthesis of p-nitrophenol Na:

Initially, a separable flask having 1 liter of capacity and a mechanical stirrer secured therein was fed with aqueous solution containing 192.99 grams (1.39 mol) of p-nitrophenol and 55.5 grams (1.39 mol) of sodium hydroxide dissolved in 500 cc of water. After carrying on reaction between them at 100° C. for 4 hours, the reacted aqueous solution was brought back to room temperature. After storing the reacted solution under still condition overnight, crystals were precipitated, and then, crystals were collected on a filtering bed. To dehydrate water content, crystals were rinsed with toluene. After fully drying them, 165.57 grams of sodium salt was yielded at the yield rate of 70.3%.

Synthesis of bis(2-(4-nitrophenoxy)ethyl)ether

Initially, a separable flask with 1 liter of capacity being furnished with a drip-funnel and a mechanical stirrer was fed with 74.5 grams (0.46 mol) of p-nitrophenol sodium salt and 250 milliliter of DMP, and then reacted them at 140° C. After complete dissolution of sodium salt, 33 grams (0.23 mol) of dichloroethylether was slowly dripped down via the drip-funnel. After carrying on the reaction overnight, the reacted solution was added to a large volume of water and then precipitates were yielded. After collecting the precipitates via absorptive filtration, collected precipitates were recrystallized to result in the generation of 56.66 grams (at 70.3% of the yield rate) of dinitro bis(2-(4-nitrophenoxy)ethyl) ether. Melt point thereof was 157° C. (157° C. as per a related documentary data).

Synthesis of bis(2-(4-aminophenoxy)ethyl)ether:

Initially, a separable flask with 1 liter of capacity being furnished with a Jim-funnel reflux condenser tube, a drip-funnel, and a mechanical stirrer, was fed with 23.63 grams (0.067 mol) of bis (2-(4-nitrophenoxy)ethyl)ether, 500 milliliter of ethanol, and 3 grams of 10% palladium active carbon. After continuing refluxing, 16 grams (0.135 mol) of hydrazine hydrate was slowly dripped down via the drip funnel. After carrying on refluxing overnight, using a sellaite bed, palladium active carbon was filtered under reduced pressure. Next, solvent was removed via distillation under reduced pressure to result in the generation of solid crude products. After recrystallizing the generated product by immersing them in ethanol used as solvent, 15.9 grams (at 81.8% of the yield rate) of diamine bis (2-(4-aminophenoxy) ethyl) ether was yielded. Melt point of said product was 60.7° C. against 60° C. quoted in a related document.

EXAMPLE 1

Initially, 16.9 grams of benzophenon tetracarbonic-acid dianhydride (hereinafter merely being referred to as BTDA) and 25.4 grams of dimethyl formamide (DMF), were respectively placed in a triple-port flask having 500 milliliter of capacity. At the same time, the flask was filled with nitrogen via substitution, and then supplied chemicals were fully dissolved via agitation with a stirrer. Next, using 10 grams of DMF, 21.6 grams of 2,2'bis[4-(4-aminophenoxy) phenyl] propane (BAPP) was added to the dissolved constituents, and then the mixed constituents generated reaction between them while being cooled off with ice water. Next, using 75 grams of DMF, 38 grams of 3,3',4,4'-ethylene glycol dibenzoate tetracarbonic-acid dianhydride (EGDA) was added to the reacted constituents. Also, using 75 grams of DMF, 23.6 grams of BAPP and 11.52 grams of 1,3-bis(3-aminophenoxy) benzene (APB) were respectively added to the above, and then the mixture was subject to reaction while being cooled off with ice water. Next, while paying attention to viscosity of the reacted solution in the triple-port flask, solution containing 2.06 grams of EGDA dissolved in 40 grams of DMF was gradually fed to the flask. When viscosity reached the maximum, feeding of BAPP solution was terminated, and then the mixed solution was aged for an hour while being stirred. Next, 40 grams of DMF was added to the aged solution and then stirred before eventually yielding solution of polyamide acid. Reached viscosity is shown in Table 1.

TABLE 1

| | R | $Ar_1$ | $Ar_2$ | x, y, z | ARRIVAL VISCOSITY |
|---|---|---|---|---|---|
| EXAMPLE 1 | —CH₂CH₂— | | [phenyl-O-phenyl-O-phenyl] | | 1500 |
| EXAMPLE 2 | —CH₂CH₂— | | —Rg—Si(CH₃)₂—(O—Si(CH₃)₂)ⱼ—Rg— | | |
| EXAMPLE 3 | —CH₂CH₂— | | [phenyl-O-phenyl-O-phenyl] | | 2300 |
| EXAMPLE 4 | —CH₂CH₂— | | [phenyl-O(CH₂CH₂O)-phenyl] | x = 3 | 4000 |
| EXAMPLE 5 | [phenyl-C(CH₃)₂-phenyl] | | [phenyl-O-phenyl-O-phenyl] | y = 5 | 3500 |

TABLE 1-continued

| | R | Ar$_1$ | Ar$_2$ | x y, z | ARRIVAL VISCOSITY |
|---|---|---|---|---|---|
| EXAMPLE 6 | -C$_6$H$_4$-C(CH$_3$)$_2$-C$_6$H$_4$- | | -C$_6$H$_4$-O-C$_6$H$_4$-O-C$_6$H$_4$- | z = 2 | 1800 |
| EXAMPLE 7 | -C$_6$H$_4$-C(CH$_3$)$_2$-C$_6$H$_4$- | | -C$_6$H$_4$-O(CH$_2$CH$_2$O)-C$_6$H$_4$- | | 2000 |
| COMP. EXAMPLE 1 | — | | — | x = 1 y = 0 | 2500 |
| COMP. EXAMPLE 2 | — | | — | z = 0 | 3000 |

Then, the yielded polyamide acid solution was spread over a PET film via coating. After heating the coated object at 85° C. for 25 minutes, the heated substance was peeled off from the PET film and then secured to a metallic supporter. Next, the heated substance was further heated at 150° C., 200° C., 250° C., 270° C., and 300° C., for 5 minutes, respectively before eventually yielding a polyimide film.

Next, an electrolyzed copper foil having 35 μm of thickness, a polyimide film having 25 μm of thickness, and another polyimide film "APICAL" NP1 (a product and a registered trade name of Kanegafuchi Chemical Industrial Co., Ltd.) having 50 μm of thickness were superposed and then pressurized for 10 minutes at 250° C. with 30 kg/cm$^2$ of pressure, and finally a flexible copper-coated laminate was yielded. Peeling strength of the yielded flexible copper-coated laminate was measured according to specification of JIS-C6481. Results of measuring a variety of physical characteristics are summarized in Table 2.

done for Example 1, polyamide acid solution was produced. Maximum viscosity reached by the produced polyamide acid solution was measured. Rated results are shown in Table 1. The produced polyimide acid solution was spread on a PET film via coating, and then the coated solution was heated at 80° C. for 25 minutes. After being peeled off from the PET film, the heated substance was secured to a metallic supporter, then heated substance was heated at 150° C., 200° C., 250° C., 270° C., and 300° C., for 5 minutes respectively before eventually yielding a polyimide film. Next, based on ASTM D-570 specification, the yielded polyimide film was immersed in pure water at 20° C. for 24 hours to prove 0.5% of hygroscopic degree. The yielded polyimide film exhibited 2.95 of dielectric constant and 146° C. of glass transition point via applied DMA.

Next, by way of superposing a 35 μm thick electrolyzed copper foil, a 25 μm thick polyimide film produced from the above processes, and a 50 μm thick polyimide film "API-

TABLE 2

| | HYGROSCOPIC DEGREE (%) | DIELECTRIC CONSTANT (-) | GALASS TRANSITION TEMPARATURE (° C.) | PEELINGE STRENGTH (kg/cm) | LOWEST APPLICABLE TEMPARATURE (° C.) |
|---|---|---|---|---|---|
| EXAMPLE 1 | 0.7 | 2.8 | 160 | 1.4 | |
| EXAMPLE 2 | 0.5 | 2.95 | 146 | 1.1 | -269 |
| EXAMPLE 3 | 0.8 | 2.9 | 167 | 1.7 | |
| EXAMPLE 4 | 0.4 | 3.0 | 162 | 1.6 | |
| EXAMPLE 5 | 0.5 | 2.9 | 220 | 1.5 | |
| EXAMPLE 6 | 0.6 | 2.9 | 232 | 1.4 | |
| EXAMPLE 7 | 0.9 | 2.8 | 215 | 1.3 | |
| COMP. EXAMPLE 1 | 3.4 | 3.4 | >400 | No adhesion | |
| COMP. EXAMPLE 2 | 1.9 | 3.3 | 230 | 0.6 | |
| COMP. EXAMPLE 3 | 2.6 | 3.5 | | No adhesion | |
| COMP. EXAMPLE 4 | 3.2 | 3.4 | | No adhesion | |
| COMP. EXAMPLE 7 | 0.8 | 3.2 | 70 | 0.1 | -60 |

EXAMPLE 2

By way of replacing 1,3-bis(3-aminophenoxy) benzene (APB) used for Example 1 with 7.4 grams of α, ω-bis(3-aminopropyl) dimethyl siloxane, in the same way as was CAL" 50NP1 (a product and a registered trade name of Kanegafuchi Chemical Industrial Co., Ltd.), a thermal pressing process was executed against them at 250° C. for 10 minutes by applying 30 kg/cm$^2$ of pressure. Finally, a flexible copper coated laminate was produced. Next, based on JIS C6481 specification, peeling strength of the produced flexible copper-coated laminate was measured. Results of measuring a variety of physical characteristics are summarized in Table 2.

EXAMPLE 3

A 25 μm thick polyimide film and a flexible copper coated laminate were produced from the above processes by using 11.6 grams of bis(2-(4-aminophenoxy)ethyl) ethel in stead of APB in Example 1. Results of measuring a variety of physical characteristics are summarized in Tables 1 and 2.

EXAMPLE 4

A 25 μm thick polyimide film and a flexible copper coated laminate were produced from the above processes by using 11.52 grams of 1,3-bis(4-aminophenoxy)benzen in stead of APB in Example 1. Results of measuring a variety of physical characteristics are summarized in Tables 1 and 2.

EXAMPLE 5

A 25 μm thick polyimide film and a flexible copper coated laminate were produced from the above processes by using 56.16 grams of 2,2'-bis(4-hydroxyphenyl) propanedibenzoate-3,3',4,4'-tetracalbonic-acid dianhydride in stead of EGDA in Example 1. Results of measuring a variety of physical characteristics are summarized in Tables 1 and 2.

EXAMPLE 6

A 25 μm thick polyimide film and a flexible copper coated laminate were produced from the above processes by using 11.6 grams of bis(2-(4-aminophenoxy)ethyl) ethel in stead of APB in Example 5. Results of measuring a variety of physical characteristics are summarized in Tables 1 and 2.

EXAMPLE 7

A 25 μm thick polyimide film and a flexible copper coated laminate were produced from the above processes by using 11.52 grams of 1,3-bis(4-aminophenoxy)benzen in stead of APB in Example 5. Results of measuring a variety of physical characteristics are summarized in Tables 1 and 2.

COMPARATIVE EXAMPLE 1

A polyimide film having 25 μm of thickness was produced from pyromellitic acid dianhydride and 2,2'bis[4-(4-aminophenoxy)phenyl] propane (BAPP). Despite of effort for manufacturing a flexible copper-coated laminate, the produced polyimide film failed to adhere onto a copper foil, and thus, no laminate was produced. As was done for Example 1, viscosity, hygroscopic degree (%), and dielectric constant of the produced polyimide film were respectively measured. Results are also shown in Tables 1 and 2.

COMPARATIVE EXAMPLE 2

In the same way as was done for Example 1, a 25 μm thick polyimide film was produced from benzophenon tetracarbonic-acid dianhydride (BTDA) and BAPP, and then a flexible copper-coated laminate was manufactured. A variety of physical characteristics were measured as was done for Example 1. Results are also shown in Tables 1 and 2.

COMPARATIVE EXAMPLE 3

After producing polyamide acid solution from pyromellitic acid dianhydride and o-Octyl-n-Decyl Adipate (ODA), in the same way as was done for Example 1, a 25 μm thick polyimide film was produced. Despite of effort for manufacturing a flexible copper-coated laminate by applying the produced polyimide film as was done for Example 1, no laminate was produced due to failure to achieve thermal fusible adhesion. As was done for Example 1, hygroscopic degree (%) and dielectric constant of the produced polyimide film were respectively measured. Results are also shown in Table 2.

COMPARATIVE EXAMPLE 4

After producing polyamide acid solution from pyromellitic acid dianhydride and paraphenylene diamine, in the same way as was done for Example 1, a 25 μm thick polyimide film was produced. Despite of effort for manufacturing a flexible copper-coated laminate by applying the produced polyimide film as was done for Example 1, due to failure to achieve thermal fusible adhesion of the film onto a copper foil, no laminate was produced. As was done for Example 1, hygroscopic degree (%) and dielectric constant of the produced polyimide film were respectively measured. Results are also shown in Table 2.

EXAMPLE 8

Figure 21:
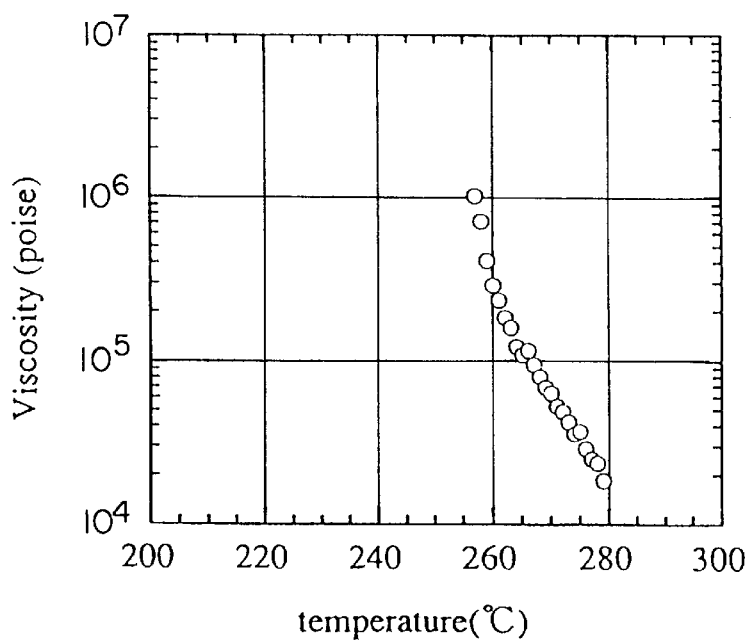
FIG. 21 is a diagram exemplifying the relationship between viscosity of molten and extruded powder particles of thermoplastic polyimide comprising novel copolymer having thermal fusible adhesive property described in Example 8 and temperature thereof.

Initially, 100 gram of polyamide acid solution yielded in the course of implementing Example 2 was put in a triple-port flask having 1 liter of capacity, and then, 900 grams of DMF, 5.0 gram of β-picoline, and 8.0 grams of acetic anhydride, were respectively added to said polyamide acid solution, and then, mixed solution was stirred for 2 hours while being cooled off with ice water. Next, the prepared solution was dripped into methanol agitated at a high rate. Yarn-like polyimide precipitated in methanol was then dried at 150° C. for 30 minutes and then ground with a mixer. Next, ground substance was heated at 250° C. for 2 minutes to fully imidize it to eventually yield powder particles of polyimide. Viscosity in the course of extruding molten polyimide powder particles was measured. Results are shown in a diagram of FIG. 21.

EXAMPLE 9

Initially, each 10.0 grams of isoquinoline, acetic anhydride, and DMF, were placed in a female flask having 100 milliliter of capacity and then stirred well. Next, solution prepared in this female flask was added to 100 grams of polyamide acid solution yielded in the course of implementing Example 1, and then mixed solution was fully stirred for 2 minutes. After extracting air, the mixed solution was spread on a PET film via coating, and then the coated substance was heated at 80° C. for 25 minutes before generating a film. Then, the PET film was stripped off. Next, by securing edges of the produced film, heating was effected by continuously raising temperature from 100° C. to 250° C., against the produced film for 5 minutes after reaching 250° C. so that the film could be imidized. Finally, thermoplastic polyimide films each having 25 μm of thickness were produced.

EXAMPLE 10

After fully drying powder particles of polyimide generated in the course of implementing Example 8, dried polyimide powder particles were supplied from an extruding hopper provided with a cyclic dice and a sizing sleeve having a vacuum tank, and finally, thermoplastic polyimide tubular films each having 50 μm of thickness and 20 cm of length were produced. As a result of executing tests for evaluating resistivity against radioactive rays by irradiating 2 Mev of electronic rays by 5 MGy against the produced tubular films, no discoloration was generated in the tested films at all.

EXAMPLE 11

After superposing a non-thermoplastic polyimide film "APICAL" (a product and a registered trade name of Kanegafuchi Chemical Industrial Co., Ltd.), a thermoplastic polyimide film yielded from Example 9, and a peelable paper thereon, a laminating process was executed against them at 150° C. at a rate of 2.2 cm/min., and then produced a laminated film usable for covering a wire. Next, in order to make reference to adhesive strength between the produced material for insulating and covering wires and the objective wires, the wire-covering laminated film and a copper foil were superposed and then thermocompression-bonded each other at 200° C. for 10 minutes via 30 kg/cm$^2$ of pressure before eventually producing a copper-coated laminate. It was proved that the yielded copper-coated laminate exerted 1.1 kg/cm of peeling strength. After testing resistivity of the yielded laminated film against radioactive rays by irradiating 2 MeV of electronic rays against it by 5 MGy, neither discoloration nor deterioration of proper characteristics of the laminated film was generated.

COMPARATIVE EXAMPLE 5

Instead of using polyimide resin incorporating thermoplasticity (adhesive property), using an epoxy adhesive agent "Epicoat" (a product and a registered trade name of Yuka-Shell Co., Ltd.), in the same way as was done for Example 11, a laminated film was yielded before eventually producing a copper-coated laminated board. As was done for Example 11, a test for evaluating resistivity of the completed laminated film against radioactive rays was carried out by irradiating 2 MeV of electronic rays by 5 MGy, and in consequence, the laminated film turned into black.

EXAMPLE 12

By sequentially superposing a non-thermoplastic polyimide film "APICAL" (a product and a registered trade name of Kanefafuchi Chemical Industrial Co., Ltd.), a polyimide film produced by implementing Example 9, and a peelable paper thereon, a laminating process was executed against them at 150° C. and 2.2 cm/min. of processing rate before eventually completing a laminated film for covering a wire. In order to make reference to adhesive strength between the laminated film and the wire, a copper foil was superposed on the laminated film and then thermocompression bonding was executed against them at 200° C. for 10 minutes by applying 30 kg/cm$^2$ of pressure before eventually producing a copper-coated laminated board, which proved to have exhibited 1.1 kg/cm of peeling strength according to a test carried out in conformity with JIS K6581 specification (at room temperature). Test results are shown in Table 2.

EXAMPLE 13

By superposing a 35 μm thick electrolyzed copper foil, a 25 μm thick thermoplastic polyimide film yielded by implementing Example 2, and a 50 μm thick polyimide film "APICAL" NP1 (a product and a registered trade name of Kanegafuchi Chemical Industrial Co., Ltd.), a thermal pressurizing process was executed against them at 240° C. for 10 minutes by applying 20 kg/cm$^2$ of pressure, and then produced a flexible copper-coated laminate board. Peeling strength was tested in conformity with JIS C6481 specification. Test results are shown in Table 2.

EXAMPLE 14

Initially, as shown in FIG. 5, a 10 μm thick thermoplastic polyimide film comprising thermoplastic polyimide resin yielded by implementing Example 2 as a reflection film was thermally dissolved at 200° C., and then, molten substance was spread on an aluminium foil via coating so that 10 μm of thickness could be generated. Next, another aluminium foil was superposed on a surface of the thermoplastic polyimide, and finally, after cooling off them, reflection films were completed. On the other hand, using intertwined 20-mesh nets each comprising 20-denier polyamide yarns serving as spacers, a laminated thermal insulation material comprising 50 laminated layers was produced by sewing them with reflection films. After heating the laminated thermal insulation material at 200° C. for 30 minutes, external appearance of the heated material remained unaffected.

COMPARATIVE EXAMPLE 6

Initially, an epoxy adhesive agent was applied onto the surface of a polyester film via coating, and then, by superposing an aluminium foil thereon, a reflection film was produced. However, as a result of testing resistivity of the reflection film against radioactive rays by irradiating 2 MeV of electronic rays against it by 5 MGy, the tested film turned into black. On the other hand, after heating another reflection film composed of polyester film prepared via the above-referred process at 200° C. for 30 minutes, the heated film was softened and contracted.

EXAMPLE 16

Initially, copper foils (each having 10×100 mm of size) were disposed on both surfaces of a polyimide film (having 10×100 mm of size) comprising thermoplastic polyimide resin yielded in the course of executing Example 2. Copper foils were adhered onto both surfaces of the polyimide film after being thermocompression-bonded at 250° C. for 10 minutes via 30 kg/cm$^2$ of pressure, and yet, in order to prevent current from being conducted, edge portions were slit to make up tape form. The tape-shaped laminate was then wound up to complete production of a capacitor having 1.3 nF of capacity.

COMPARATIVE EXAMPLE 7

Initially, a polyethylene terephthalate film was yielded from ethylene glycol and terephthalic acid dimethyl. In the same way as was done for the preceding test methods, glass transition point (° C.), hygroscopic degree (%), and dielectric constant (–) of the yielded film were respectively measured. In addition, self-extinguishable property against fire, available minimum temperature (° C.), and adhesive strength, were also measured. Test results are shown in Table 2. In the same way as was done for Example 16, copper foils were adhered onto the yielded polyethylene terephthalate film to form a tape-shaped material via winding, and finally completed a capacitor.

INDUSTRIAL APPLICABILITY

A novel copolymer having thermal fusible adhesive property featuring the following properties was obtained from the present invention. They are distinct properties in terms of mechanical strength, resistivity against radioactive rays, chemical resistant property, stable characteristic under low temperature, thermal resistant property, processability, adhesive property, and stable thermal fusible adhesive property simultaneously satisfying low hygroscopic characteristic and stable dielectric constant, and being able to contribute to shorten processing time of a cover lay film in adhering process with flexible printed circuit. In addition, powder particles, film, laminated film, laminated heat insulating material, electronic modules and capacitors which were made from thermoplastic resin mainly comprising the novel copolymer having thermal fusible adhesive property contain a variety of properties which the novel copolymer having thermal fusible adhesive property according to the present invention contains, and expand industrial applicability in various fields.

When explained in detail, a novel copolymer incorporating thermal fusible adhesive property, comprising that said novel copolymer incorporates conjunctionally a glass transition point in a range from 100° C. to a maximum of 250° C., 1% or less than 1% of hygroscopic degree and 3 or less than 3 of dielectric rate, and can be designated by general formula (1) can be utilized for electronic parts such as flexible printed circuit boards, cover-films, cover-lay films, bonding sheets, cover coat ink, lead-on chips, or lead-frame fixing tape, and electronic circuit part material corresponding to high density mounting purpose in future.

The novel copolymer related to the invention exhibits distinctly low hygroscopic degree which proved to be a maximum of 1% after being immersed in 20° C. pure water for 24 hours, and yet, the novel copolymer also exhibits extremely low dielectric constant which proved to be a maximum of 3 at 1 MHz of frequency via the Q-meter test method. By virtue of distinctly low hygroscopic degree and dielectric constant, the novel copolymer is ideally suited for composing parts of electronic circuits such as capacitors and electronic modules that should properly match the needs for implementing high-density loading of the above-referred parts in the future.

Furthermore, the novel film made from thermoplastic polyimide resin mainly comprising the novel copolymer incorporating thermal fusible adhesive property is effectively usable for composing laminated films comprising resin and/or metal or reliable adhesive agent availing of proper characteristics of copolymer, thus creating useful application to a variety of electric/electronic parts, and yet, the novel film is also usefully applicable to a variety of fields such as nuclear fusion, accelerators, superconductors, space-crafts, or the like.

Furthermore, owing to low viscosity of dissolved resin, tubularly formed film composed of thermoplastic polyimide film mainly comprising novel copolymer incorporating thermal fusible adhesive property can easily be produced, where the produced film not only contains characteristics proper to resin, but it also provides extremely high dimensional precision and thickness precision. Accordingly, the novel thermoplastic polyimide film is usefully applicable to flexible printed circuit boards, insulation films, seat belts, and yet, it is also effectively applicable to a variety of sophisticated fields such as medical instruments, optical parts, or precision electronic parts requiring extremely high precision.

Furthermore, compared with such cases in which conventional adhesive agents are being used, the inventive laminated film in the form of a flexible copper-coated laminated board comprising a base film layer composed of thermally resistant resin, an intermediate layer composed of thermoplastic polyimide resin mainly comprising the above-described copolymer incorporating thermal fusible adhesive property, and an electrically conductive layer, contains extremely high thermal resistant property, and yet, compared with any conventional polyimide adhesive agent, the inventive laminated film exhibits distinctly effective adhesive property owing to thermocompression bonding that can be exerted at a relatively low temperature and in a relatively short period of time, and thus, such a unique flexible copper-coated laminate board can be produced very easily. Furthermore, in the case of manufacturing a flexible printed circuit board, for example, after an etching process done for copper foils, perforating process can be executed by applying an alkali etching process, thus making it possible to relatively easily manufacture flexible printed circuit boards.

Furthermore, the inventive laminated film composed of thermal fusible adhesive layers comprising thermoplastic polyimide resin mainly comprising the novel copolymer incorporating thermal fusible adhesive property contains characteristics of the thermoplastic polyimide resin, and yet, the inventive laminated film can exert thermal adhesion within a temperature range that substantially does not deteriorate proper characteristics of used wires. Accordingly, when the inventive laminated film is used for covering wires, the produced film does not cause characteristics of the covered wires such as superconductivity to incur deterioration at all.

The above-described laminated thermal insulation material consisting of laminated layers of plastic films made from thermoplastic polyimide resin mainly comprising the novel copolymer incorporating thermal fusible adhesive property and laminated layers of net-form spacers composed of plastic yarns incorporates distinctly high resistivity against radioactive rays due to proper characteristics of the resin, and yet, since the laminated thermal insulation material contains negligible dielectric constant, it is usefully applicable to thermal insulation material to be built in accelerators, nuclear-fusion furnaces, or in space-crafts.

Furthermore, unlike such a conventional packaged electronic module causing water absorbed in adhesive agent layers to be thermally evaporated during soldering process to easily cause the package to generate crack or incur burst, the inventive electronic module using the thermoplastic polyimide resin mainly comprising the novel copolymer related to the invention as an adhesive agent layer securely prevents the above accidental phenomenon from occurrence. By virtue of the invention, reliability of electronic modules can be promoted. Furthermore, in terms of structure of the electronic module related to the invention, connecting part of an inner lead and a semiconductor chip is insulated by the adhesive agent layer comprising novel thermoplastic polyimide resin, and accordingly, there is no need of effecting adhesion via another insulation film, and yet, since adhesion can be achieved at a low temperature and within a short period of time, the novel electronic module according to the invention securely promotes productivity, and thus, the invention contributes to furtherance of practical utility of electronic modules.

Compared with any conventional capacitor, the novel capacitor related to the invention features extremely low hygroscopic degree owing to the provision of a dielectric layer composed of thermoplastic polyimide resin mainly comprising the novel copolymer containing thermally fusible adhesive property, and thus, applicable field of capacitors can be expanded, and yet, since the above-referred resin contains adhesive property, capacitors can easily be manufactured. In addition, the inventive capacitor is effectively applicable to a variety of fields where severe service condition such as thermal resistant property, chemical resistant property, and resistivity against radioactive rays, is critically demanded.

What is claimed is:

1. A thermally-fusible adhesive copolymer, said copolymer having a glass transition point in a range of from 100° C. to 250° C., a hygroscopic degree of not more than 1%, and a dielectric rate of not more than 3, said copolymer having a general formula (1) as follows

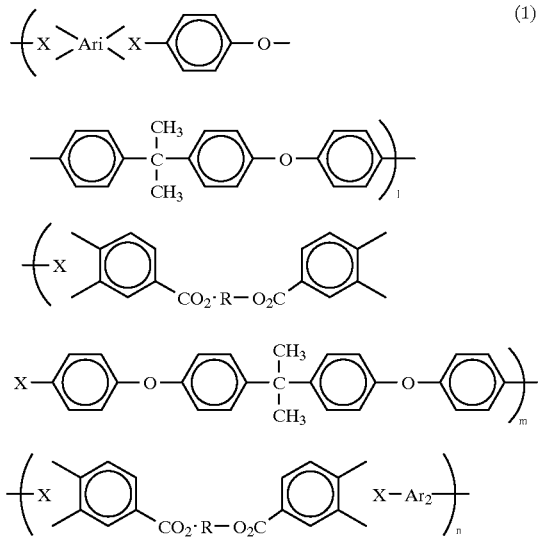

wherein $Ar_1$ represents a quadrivalent organic radical, $Ar_2$ represents a divalent organic radical, R represents a divalent organic radical selected from the group consisting of

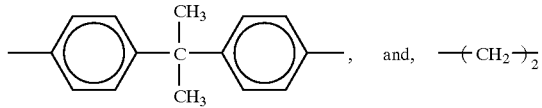

wherein X represents a trivalent bonding radical selected from the group consisting of

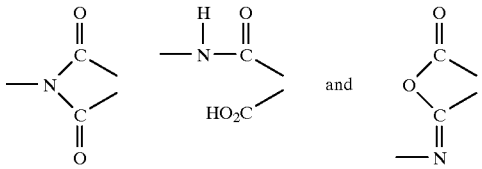

wherein m and n are each integers of 0 or more, and the sum of m and n is an integer of 1 or more, and wherein l is an integer of 1 or more.

2. A thermally-fusible adhesive copolymer according to claim 1, wherein said quadrivalent organic radical $Ar_1$ is at least one member selected from the group consisting of

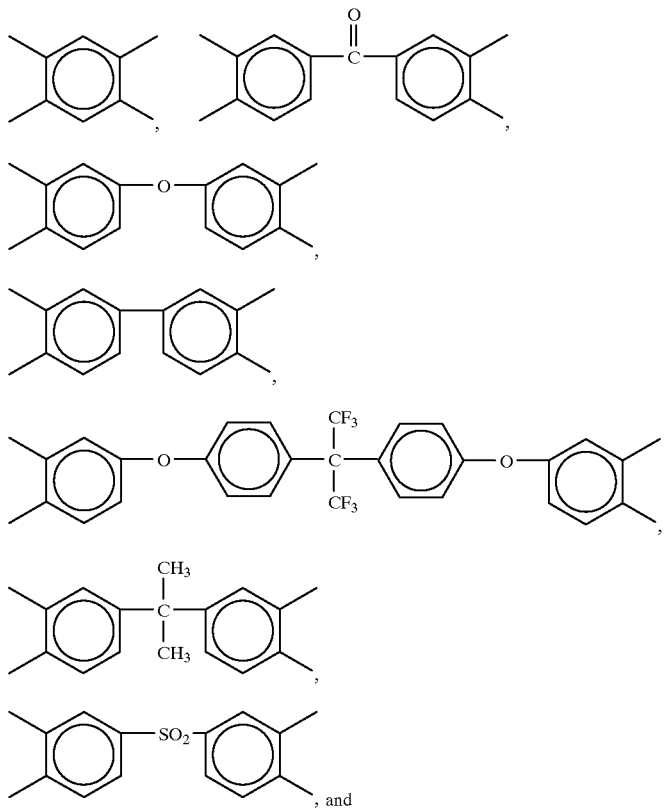

-continued

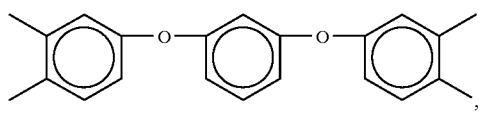

3. A thermally-fusible adhesive copolymer according to claim 1, wherein said divalent radical $Ar_2$ is at least one member selected from the group consisting of

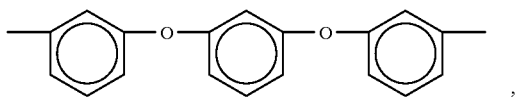

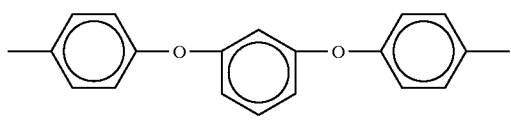

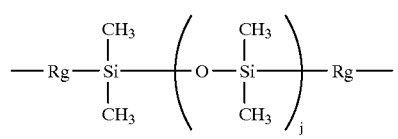

and

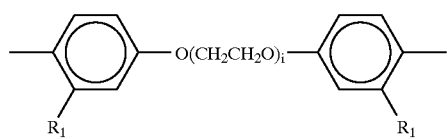

wherein Rg represents a methyl, ethyl, propyl, butyl, pentyl, or phenyl radical, wherein j is an integer in a range of from 1 to 10, wherein Rf represents hydrogen or a methyl radical, and wherein i is an integer in a range of from 1 to 4.

4. Powder particles comprising a thermoplastic polyimide resin, said thermoplastic polyimide resin comprising the thermally-fusible adhesive copolymer of claim 1.

5. A film comprising a thermoplastic polyimide resin, said thermoplastic polyimide resin comprising the thermally-fusible adhesive copolymer of claim 1.

6. A film according to claim 5, wherein said film has a tubular configuration.

7. A method of manufacturing a film having a tubular configuration, said method comprising the sequential steps of:
   fully drying a thermoplastic polyimide resin comprising the thermally-fusible adhesive copolymer of claim 1;
   charging the fully dried thermoplastic polyimide resin into a melting/extruding machine; and
   melt extruding the charged, fully dried thermoplastic polyimide resin into tubular form.

8. A film comprising:
   a base film layer made from a thermally resistant resin; and
   a thermally-fusible adhesive layer made from a thermoplastic polyimide resin, said thermoplastic polyimide resin comprising the thermally-fusible adhesive copolymer of claim 1.

9. A film according to claim 8, wherein said thermally resistant resin is a non-thermoplastic rein comprising at least one acid dianhydride selected from the group consisting of

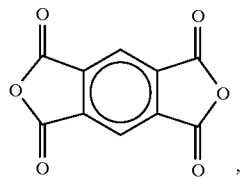

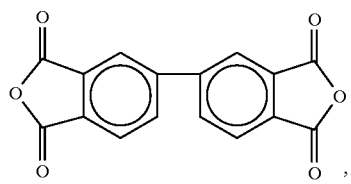

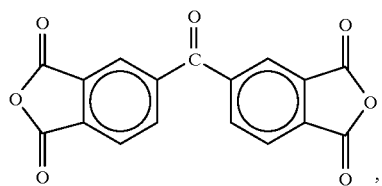

and

-continued

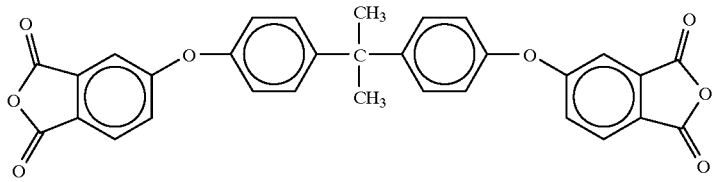

and at least one diamine selected from the group consisting of

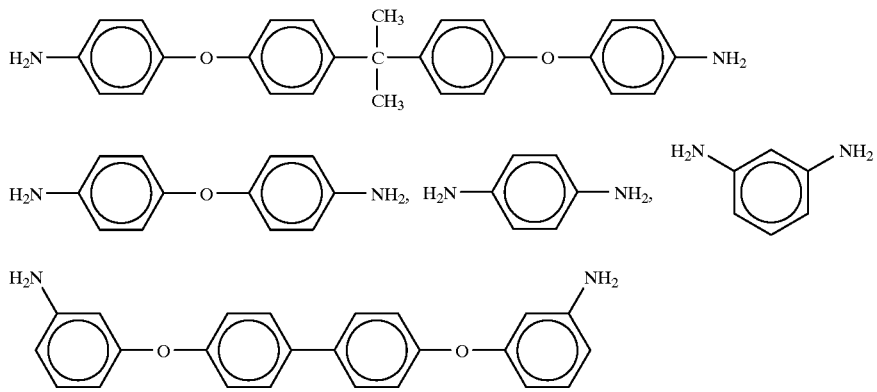

and

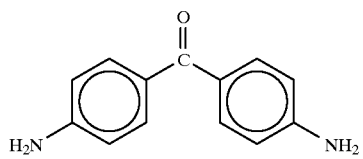

10. A film comprising:
    a conductive layer comprising an electrical conductor; and
    a film layer made from a thermoplastic polyimide resin, said thermoplastic polyimide resin comprising the thermally-fusible adhesive copolymer of claim 1.

11. A film comprising:
    a base film layer;
    an intermediate layer made from a thermoplastic polyimide resin, said thermoplastic polyimide resin comprising the thermally-fusible adhesive copolymer of claim 1; and
    a conductive layer comprising an electrical conductor.

12. A laminated heat insulating material comprising:
    a series of reflective films, said reflective films having respective metal layers formed on one of the surfaces of the reflective films, portions of the reflective films being made from a thermoplastic polyimide resin comprising the thermally-fusible adhesive copolymer of claim 1; and
    net-form spacers made from plastic yarns, said spacers being arranged to interpose any two reflective films of said series of reflective films so that said two reflective films do not come into direct contact with each other.

13. A laminated heat insulating material according to claim 12, wherein said spacers are made from textile fabric or knit comprising plastic yarns, each of which has a maximum thickness of 50 deniers.

14. A laminated heat insulating material according to claim 12, wherein said reflective films are arranged so that one or both surfaces of each of said metal layers is on a cured film comprising a meltable substance or solution of the thermoplastic polyimide resin comprising the thermally-fusible adhesive copolymer of claim 1.

15. A laminated heat insulating material according to claim 12, wherein said reflective films are arranged so that one or both surfaces of each of said metal layers is on an imidized, dried film formed from a solution containing a precursor of the thermoplastic polyimide resin comprising the thermally-fusible adhesive copolymer of claim 1.

16. A method of manufacturing the laminated heat insulating material of claim 12, said method comprising the steps of:
    alternately laminating the reflection films with the net-form spacers; and
    integrally adhering the reflection films and the net-form spacers by employing the thermoplastic polyimide resin as an adhesive.

17. A method of manufacturing the laminated heat insulating material of claim 12, said method comprising the steps of:
    alternately laminating the reflection films with the net-form spacers; and integrally sewing the reflection films and the net-form spacers together.

18. An electronic module comprising:

a lead frame; and an electronic element directly or indirectly connected to said lead frame via an adhesive agent layer, wherein said electronic module is sealed with a resin, except for a part of said lead frame, and wherein said adhesive agent layer formed from a thermoplastic polyimide resin comprising the thermally-fusible adhesive copolymer of claim 1.

19. A capacitor comprising a dielectric layer formed from a thermoplastic polyimide resin comprising the thermally-fusible adhesive copolymer of claim 1.

* * * * *